(12) United States Patent
Ali-Ahmad et al.

(10) Patent No.: US 7,586,389 B2
(45) Date of Patent: Sep. 8, 2009

(54) IMPEDANCE TRANSFORMATION AND FILTER USING BULK ACOUSTIC WAVE TECHNOLOGY

(75) Inventors: Walid Y. Ali-Ahmad, Cupertino, CA (US); Hans Dropmann, Emerald Hills, CA (US); Carlton Stuebing, Portland, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 222 days.

(21) Appl. No.: 11/471,031

(22) Filed: Jun. 19, 2006

(65) Prior Publication Data

US 2007/0290767 A1    Dec. 20, 2007

(51) Int. Cl.
  *H03H 9/54* (2006.01)
  *H03H 9/70* (2006.01)
  *H03H 7/38* (2006.01)
  *H03H 3/02* (2006.01)
(52) U.S. Cl. .................. 333/133; 333/32; 333/189
(58) Field of Classification Search ............. 333/188, 333/189, 32, 187, 133
  See application file for complete search history.

(56) References Cited

U.S. PATENT DOCUMENTS

| 5,592,135 | A | * | 1/1997 | Taguchi et al. ............. 333/193 |
| 5,883,575 | A | | 3/1999 | Ruby et al. |
| 5,894,647 | A | | 4/1999 | Lakin |
| 5,942,958 | A | | 8/1999 | Lakin |
| 6,107,721 | A | | 8/2000 | Lakin |
| 6,262,637 | B1 | | 7/2001 | Bradley et al. |
| 6,323,744 | B1 | | 11/2001 | Barber et al. |
| 6,351,236 | B1 | | 2/2002 | Hasler |
| 6,377,136 | B1 | | 4/2002 | Rittenhouse et al. |
| 6,404,302 | B1 | | 6/2002 | Satoh et al. |
| 6,420,202 | B1 | | 7/2002 | Barber et al. |
| 6,462,631 | B2 | | 10/2002 | Bradley et al. |
| 6,472,954 | B1 | | 10/2002 | Ruby et al. |
| 6,489,862 | B1 | * | 12/2002 | Frank ..................... 333/187 |
| 6,542,055 | B1 | | 4/2003 | Frank et al. |

(Continued)

FOREIGN PATENT DOCUMENTS

JP        09-246889 A    0/1997

(Continued)

OTHER PUBLICATIONS

O. Ikata, T. Miyashita, T. Matsuda, T. Nishihara, & Y. Satoh Development of Low-Loss Band-Pass Filters Using Saw Resonators for Portable Telephones, 1992, 1992 IEEE Ultrasonics Symposium, pp. 111-115.

(Continued)

*Primary Examiner*—Barbara Summons
(74) *Attorney, Agent, or Firm*—North Weber & Baugh LLP

(57) ABSTRACT

A system, apparatus and method for providing filtering functionality and impedance transformation within a BAW resonator network are disclosed. In particular, a BAW resonator network is designed to provide band pass capability and a transformation between its input impedance and output impedance. By effectively integrating impedance matching functionality within the BAW resonator network, discrete impedance matching elements previously required within a system may be removed or reduced in size. As a result, matching networks and their associated component costs, insertion losses, and board size contributions may be reduced.

35 Claims, 19 Drawing Sheets

U.S. PATENT DOCUMENTS

| | | | |
|---|---|---|---|
| 6,670,866 B2 * | 12/2003 | Ella et al. | 333/133 |
| 6,710,677 B2 | 3/2004 | Beaudin et al. | |
| 6,710,681 B2 | 3/2004 | Figueredo et al. | |
| 6,720,844 B1 | 4/2004 | Lakin | |
| 6,774,857 B2 | 8/2004 | Frank | |
| 6,803,835 B2 | 10/2004 | Frank | |
| 6,879,224 B2 | 4/2005 | Frank | |
| 6,909,340 B2 | 6/2005 | Aigner et al. | |
| 6,924,715 B2 | 8/2005 | Beaudin et al. | |
| 6,933,807 B2 | 8/2005 | Marksteiner et al. | |
| 6,943,647 B2 | 9/2005 | Aigner et al. | |
| 7,057,478 B2 * | 6/2006 | Korden et al. | 333/189 |
| 7,274,270 B2 * | 9/2007 | Frank | 333/32 |
| 7,459,992 B2 | 12/2008 | Matsuda et al | |
| 2002/0153965 A1 | 10/2002 | Ruby et al. | |
| 2003/0092408 A1 | 5/2003 | Frank | |
| 2003/0112098 A1 | 6/2003 | Frank | |
| 2003/0112768 A1 | 6/2003 | Frank | |
| 2003/0210108 A1 | 11/2003 | Karlquist | |
| 2003/0227357 A1 | 12/2003 | Metzger et al. | |
| 2004/0051601 A1 | 3/2004 | Frank | |
| 2004/0052272 A1 | 3/2004 | Frank | |
| 2004/0102172 A1 | 5/2004 | Hendin | |
| 2004/0124952 A1 | 7/2004 | Tikka | |
| 2004/0150293 A1 | 8/2004 | Unterberger | |
| 2004/0248542 A1 * | 12/2004 | Heuermann et al. | 455/339 |
| 2004/0257172 A1 | 12/2004 | Schmidhammer et al. | |
| 2004/0263286 A1 | 12/2004 | Unterberger | |
| 2005/0093653 A1 | 5/2005 | Larson, III | |
| 2005/0093655 A1 | 5/2005 | Larson, III et al. | |
| 2005/0093658 A1 | 5/2005 | Larson, III et al. | |
| 2005/0093659 A1 | 5/2005 | Larson, III et al. | |
| 2005/0110598 A1 | 5/2005 | Larson, III | |
| 2005/0128030 A1 | 6/2005 | Larson, III et al. | |
| 2005/0208895 A1 | 9/2005 | Busson et al. | |
| 2006/0091978 A1 * | 5/2006 | Wang et al. | 333/189 |

FOREIGN PATENT DOCUMENTS

JP  08-139535 A  5/1996

OTHER PUBLICATIONS

"Filters for Communication Equipment," MuRata Catalog; May, 30, 2005; pp. 304.310.

* cited by examiner

Stage by Stage Loading Measurement Method

IMPEDANCE TRANSFORMATION AND FILTER USING BULK ACOUSTIC WAVE TECHNOLOGY

BACKGROUND

A. Technical Field

The present invention relates generally to impedance transformation within an electrical circuit, and more particularly, to the application of bulk acoustic wave (hereinafter, "BAW") technology to provide impedance transformation and filtering functionality within a resonator network.

B. Background of the Invention

The importance of impedance matching within an electrical circuit is well understood within the art. Impedance matching relates to the concept of making a source impedance equal to a load impedance in order to efficiently deliver a signal from source to load. In particular, the output load impedance seen by a power amplifier should be chosen to optimize the efficiency of that amplifier. This principle of impedance matching is important to numerous technology applications and markets, and the design of electrical circuits therein.

The wireless and RF market is an example in which impedance matching and transformation is very important in the design of electrical circuits. In fact, the high frequency RF signal may be sensitive to impedance mismatches within an electronic circuit. Electrical component characteristics (e.g., wire inductances, interlayer capacitances and conductor resistances) may significantly impact the design of impedance matching element used to connect these components, or the blocks in which they reside, in a circuit. The design and implementation of a proper impedance matching network within an RF circuit is oftentimes very complex and may require significant cost and board area in its implementation.

FIG. 1 illustrates exemplary transmit and receive signal paths within an RF environment. As illustrated, a transmit driver 110 is coupled to a band pass filter 120 via a first matching element 115. The band pass filter 120 is coupled to a power amplifier 130 via a second matching element 125. The power amplifier 130 is coupled to a duplexer 150 via a third matching element 143 and a fourth matching element 146.

On the receiver path, the duplexer 150 is coupled to a low noise amplifier 160 via a fifth impedance matching element 155. The low noise amplifier 160 is coupled to a band pass filter 170 via a sixth matching element or 165. The band pass filter 170 is coupled to other components within the receiver signal path via a seventh matching element 175.

These matching elements provide an impedance transformation between the components in the electrical circuit. For example, in an RF environment, impedance matching elements may provide an impedance step-up from $3\Omega$ to $50\Omega$ between various components or an impedance step-down from $50\Omega$ to $3\Omega$ depending on which components are being coupled. For example, the third matching network 143 and the fourth matching network 146 may provide such an impedance transformation of $3\Omega$ at the power amplifier 130 output to $50\Omega$ at the duplexer input 150. One skilled in the art will recognize that impedance matching elements may be used to match numerous different impedance values and that a particular impedance transformation may be provided by a single impedance element or multiple impedance elements in series.

The design and implementation of impedance matching impedance elements may significantly increase the complexity of an electrical system and require additional board area and cost in the realization of the system itself. Oftentimes, certain components within an electrical system may need to be located "off-chip" in order properly match the component within the system. These off-chip components provide high "Q" characteristics and very good transformation loss between components. However, the off-chip components also require additional board space in their implementation. For example, the design of an electrical circuit may require that one or more impedance matching elements be located outside of an integrated circuit for various reasons including size considerations of the matching element(s), interfacing with out off-chip components, etc. FIG. 2 illustrates one such example of an RF system having off-chip components located on a board and connected to an integrated electrical circuit by one or more matching elements.

FIG. 2 is intended to illustrate one possible scenario related to the RF system shown in FIG. 1. As illustrated, a band pass filter 230 in the transmit signal path of the RF system is separate from an integrated circuit 220 and located on a radio board 210. The band pass filter 230 is coupled within the signal path in the integrated circuit by a first matching element 235 and a second matching element 240. A duplexer 250 is coupled to the transmit signal path by a third matching element 255 and to the receiver path by a fourth matching element 260.

One skilled in the art will readily recognize the added complexity and board area required to properly couple separate electrical components (e.g., the integrated circuit 220, the band pass filter 230 and the duplexer 250) using distinct matching elements. Furthermore, the manufacturing costs associated with the electrical systems increase reflected by the fact that the components must be manufactured separately and each installed onto the board 210.

SUMMARY OF THE INVENTION

The present invention provides an apparatus and method for providing an integrated impedance transformation and filtering functionality within a BAW resonator network that may function as an impedance matching element. In particular, a BAW resonator network is considered for purposes of explanation to provide band pass capability and a transformation between its input impedance and output impedance. The magnitude of the impedance transformation and band pass characteristics may be modeled and implemented within the BAW resonator network. By effectively integrating impedance matching functionality within the BAW resonator network, discrete impedance matching elements previously required within a system may be removed or reduced in size. As a result, matching elements/networks and their associated component costs, insertion losses, and board size contributions may be reduced.

The BAW resonator network may be designed as a single stage impedance matching network. In one embodiment, a BAW "L" configuration is used to realize both filtering functionality and impedance transformation between the input and output of a single stage BAW L network. In another embodiment, a plurality of single stage BAW L networks is cascaded to provide a multi-stage BAW network. This multi-stage network may provide a larger impedance transformation between its input and output. The multi-stage network may also address shortcomings in the single stage BAW L network such as issues related to insertion and return loss quality as well as mid-band impedance reversals within the filter pass band.

The performance and manufacturability of the BAW resonator multi-stage network may depend on the number of available unique resonator stack thickness used within the network. In particular, the impedance transformation magnitude of the multi-stage network improves as the number of unique series resonant frequencies across the multi-stage network increases. However, as the number of unique resonator stack thicknesses (or unique series resonant frequencies) increases, the complexity and cost of manufacturing the multi-stage network increases.

A BAW resonator network may also be configured in other designs to allow impedance transformation and filtering between its input and output port. For example, BAW resonators may be placed in a Pi configuration, Tee configuration or Lattice configuration. All of these various configurations are intended to fall within the scope of the present invention.

One skilled in the art will recognize that numerous embodiments of the invention may be applied to various technology environments. For example, the present invention may be used to reduce the size or obviate impedance matching networks/elements within transmit and receive signal paths that interface with a duplexer or interstage filters in an RF environment.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

Figure ("FIG.") 1 illustrates an RF transceiver system including components and matching elements coupling the components therein.

DETAILED DESCRIPTION OF THE PREFERRED EMBODIMENTS

A system, apparatus and method for providing filtering functionality and impedance transformation within a BAW resonator network are disclosed. In particular, a BAW resonator network is designed to provide band pass capability and a transformation between its input impedance and output impedance. By effectively integrating impedance matching functionality within the BAW resonator network, discrete impedance matching networks/elements previously required within a circuit may be removed or reduced in size. As a result, matching networks and their associated component costs, insertion losses, and board size contributions may be reduced.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different electrical components, circuits, devices and systems. The embodiments of the present invention may function in various different types of environments wherein impedance matching is relevant including high frequency RF applications. Structures and devices shown below in block diagram are illustrative of exemplary embodiments of the invention and are meant to avoid obscuring the invention. Furthermore, connections between components within the figures are not intended to be limited to direct connections. Rather, connections between these components may be modified, re-formatted or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

A. Overview

Figure 3:
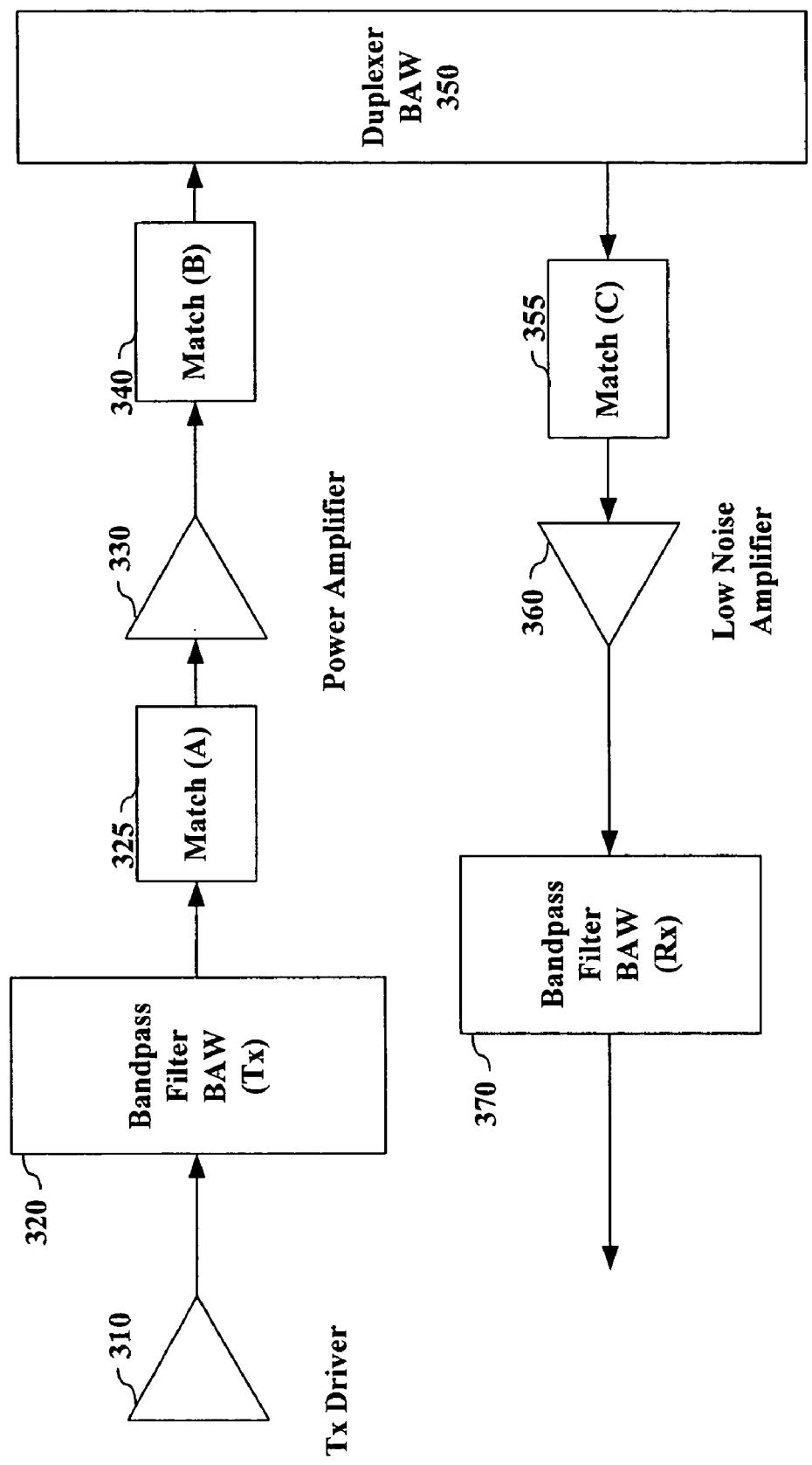
FIG. 3 illustrates an improved RF transceiver system including BAW resonator networks that provide an impedance transformation that reduce the number and/or size of matching elements according to one embodiment of the invention.

A BAW resonator network may be integrated within an electrical component, circuit or system, and modeled to provide a band pass filter and impedance transformation between its input and output. FIG. 3 is a general illustration of an example in which the present invention may reduce the size or remove the number of discrete impedance matching elements in the system shown in FIG. 1. The impedance transformation magnitude and filtering characteristics depend on a number of factors including the number of unique resonator stack thicknesses (i.e., the number of different series resonant frequencies within the network) within the resonator network.

Figure 1:
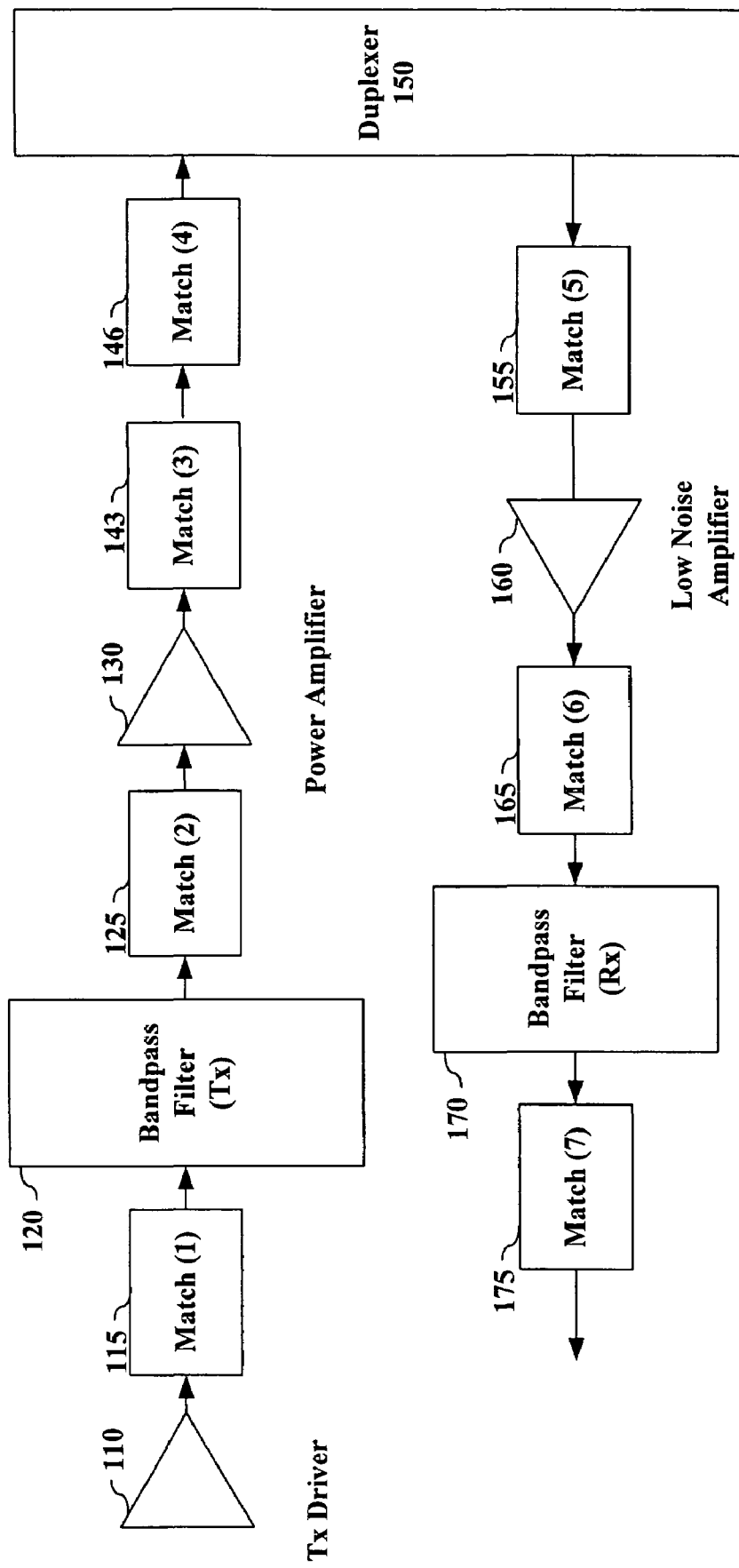
Figure 2:
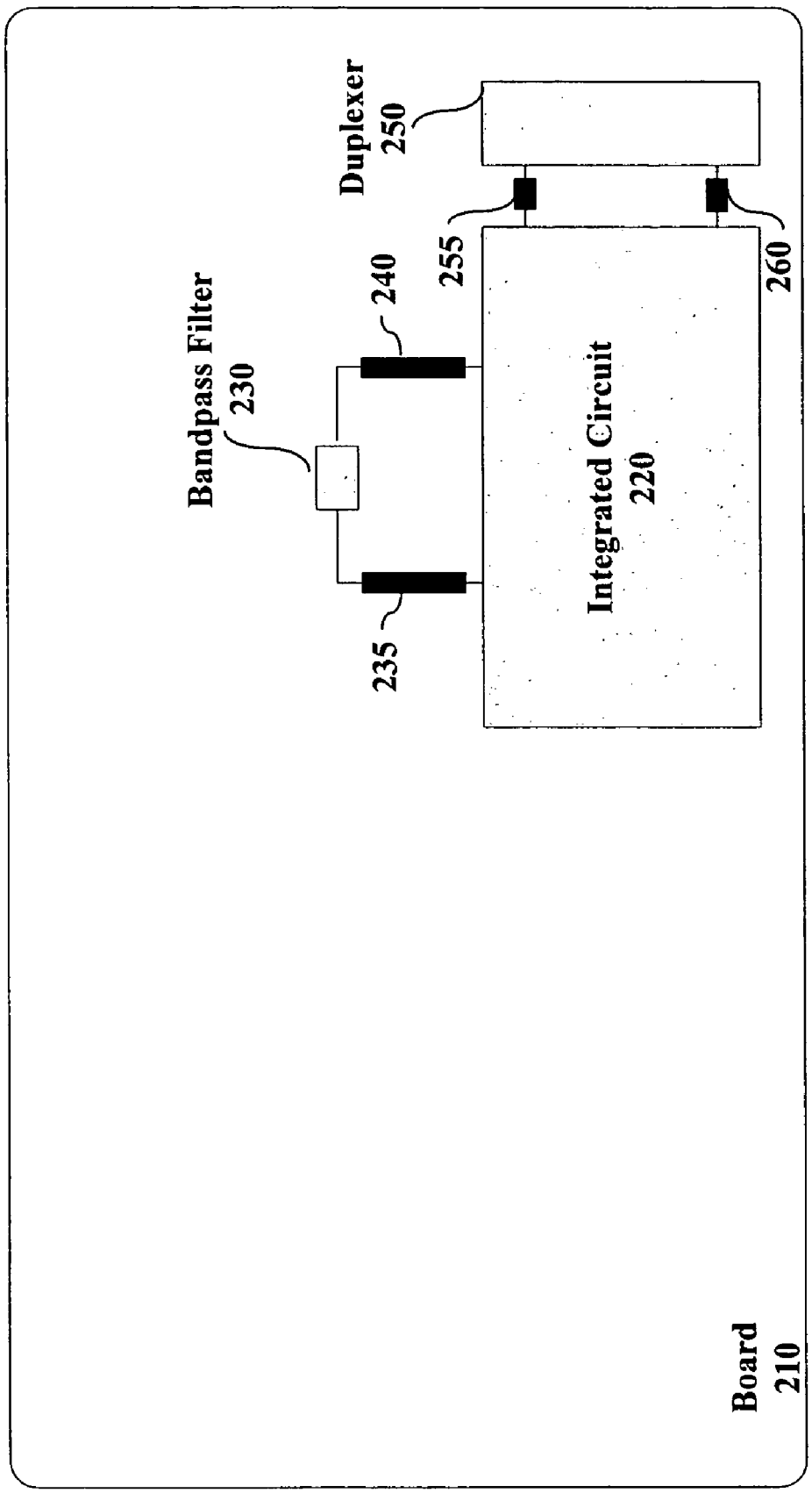
FIG. 2 is a general diagram illustrating an exemplary electrical system having matching elements coupling distinct components located on a radio board.

A review of the system shown in FIG. 3 identifies a reduction in the number of discrete impedance matching elements in relation to the system shown in FIG. 1. Additionally, the remaining discrete impedance matching elements in FIG. 3 are transforming a smaller impedance magnitude than their counterparts in FIG. 1. This reduction in the size and number of discrete impedance matching elements is provided by the integration of certain BAW resonator networks within other components within the system. Accordingly, a significant reduction in the board area required to implement the system is achieved as well as potential improvements in performance.

Referring to FIG. 3, the transmit-side band pass filter 320 comprises a BAW resonator network that provides both filtering functionality and impedance transformation. In one embodiment, the band pass filter 320 effectively allows for the removal of a discrete matching element between the filter 320 and driver 310, and a reduction in the impedance transformation between the filter 320 and the power amplifier 330. In an exemplary RF scenario, the band pass filter 320 provides impedance transformations of 60Ω+j10Ω to 50Ω on its input and 50Ω to 35Ω on its output. These integrated impedance transformations allow for the removal of the first discrete impedance matching element 115 and a reduction in the amount of transformation and corresponding size of the second discrete impedance matching element 125 illustrated in FIG. 1. The smaller discrete impedance matching element 325 (shown in FIG. 3) need only provide an impedance transformation from 30Ω to 4.2Ω+j1Ω at the power amplifier 330 as compared to the second impedance element 125 (shown in FIG. 1) which transitions from 50Ω to 4.2Ω+j1Ω.

The integration of a BAW resonator network and its corresponding filtering and impedance transformation may extend to other components within the system of FIG. 3 including the duplexer 350. A BAW resonator network may be integrated within the duplexer 350 to provide a 30Ω to 50Ω transformation at its input and require a discrete matching element 340 to transition of 4.2Ω+j1Ω to 30Ω from the power amplifier 330 as compared to 4.2Ω+j1Ω to 50Ω in the system illustrated in FIG. 1. Similarly, a BAW resonator network may be integrated on the duplexer 350 output to reduce the magnitude of impedance transformation provided by the impedance matching element 355. Furthermore, a BAW resonator network may be integrated on the receiver-side filter 370 to obviate or reduce the impedance transformation magnitude required at its input and output. In the particular example shown in FIG. 3, the BAW filtering and impedance transformation allows for the removal of discrete impedance matching elements at both its input and output.

Figure 4:
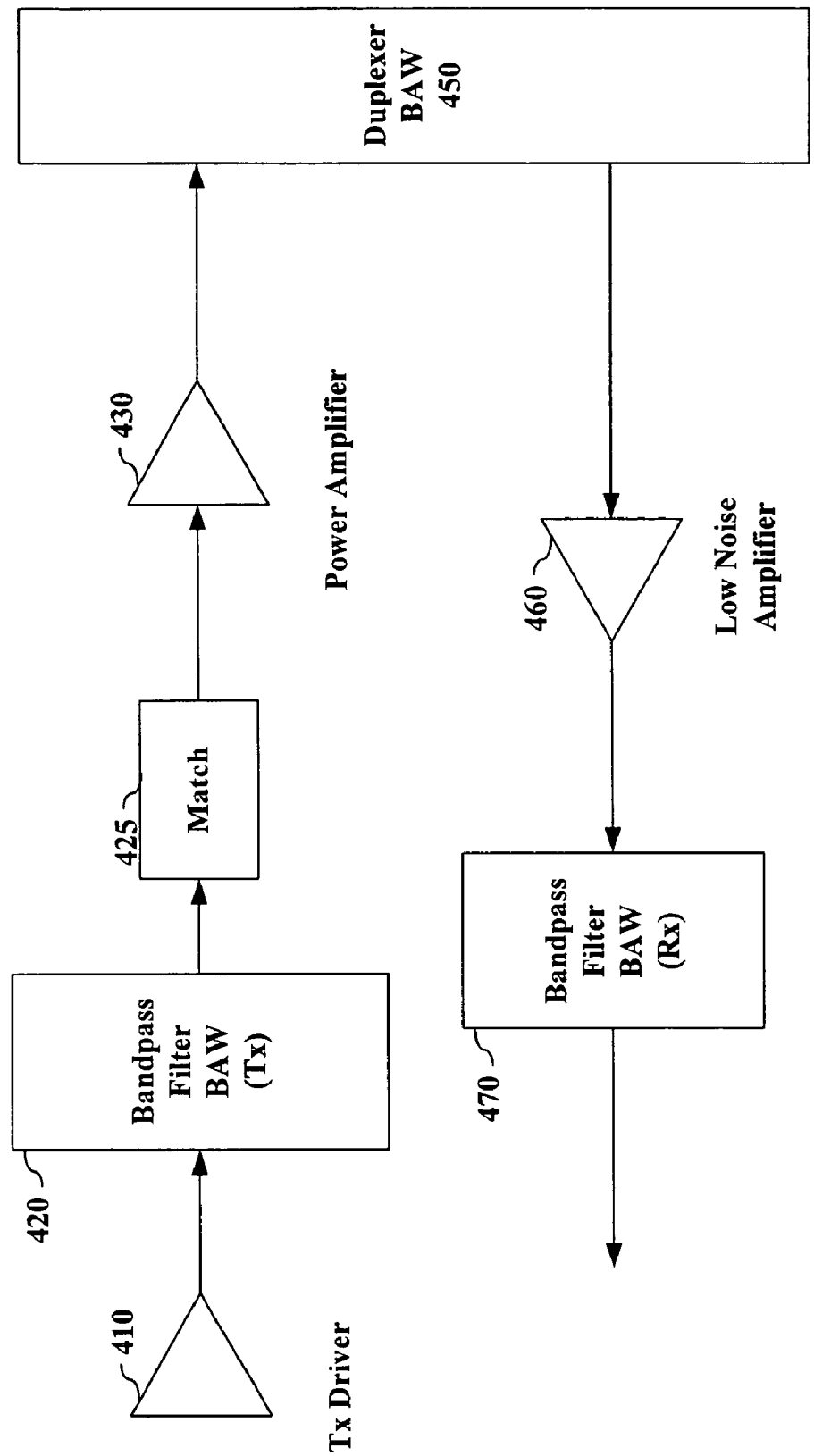
FIG. 4 illustrates a further improved RF transceiver including BAW resonator networks that provide enhanced impedance transformation that even further reduce the number and/or size of matching elements according to one embodiment of the invention.

As previously mentioned, the impedance transformation magnitude depends on the number of unique BAW resonator stack thicknesses within the network. In particular, an increase in the number of different available series resonant frequencies within the network may provide a relatively larger impedance transformation between the network input and output while providing insertion loss competitive with discrete matching networks. FIG. 4 illustrates an exemplary improvement in impedance transformation resulting in a further yet reduction in discrete matching elements and their corresponding sizes.

By way of example, this greater impedance transformation may obviate discrete matching elements at the duplexer 450 input and outputs resulting in direct connections to a power amplifier 430 at its input and a low noise amplifier 460 at its output. Furthermore, this embodiment may further reduce the impedance transformation between the power amplifier 430 and the band pass filter 420 which allows an even greater reduction of the matching network/element 425. Further yet, the embodiment may allow for the removal of discrete matching elements between the driver 410 and the transmit-side band pass filter 420 as well as at the input and output of the receive-side band pass filter 470.

Figure 5:
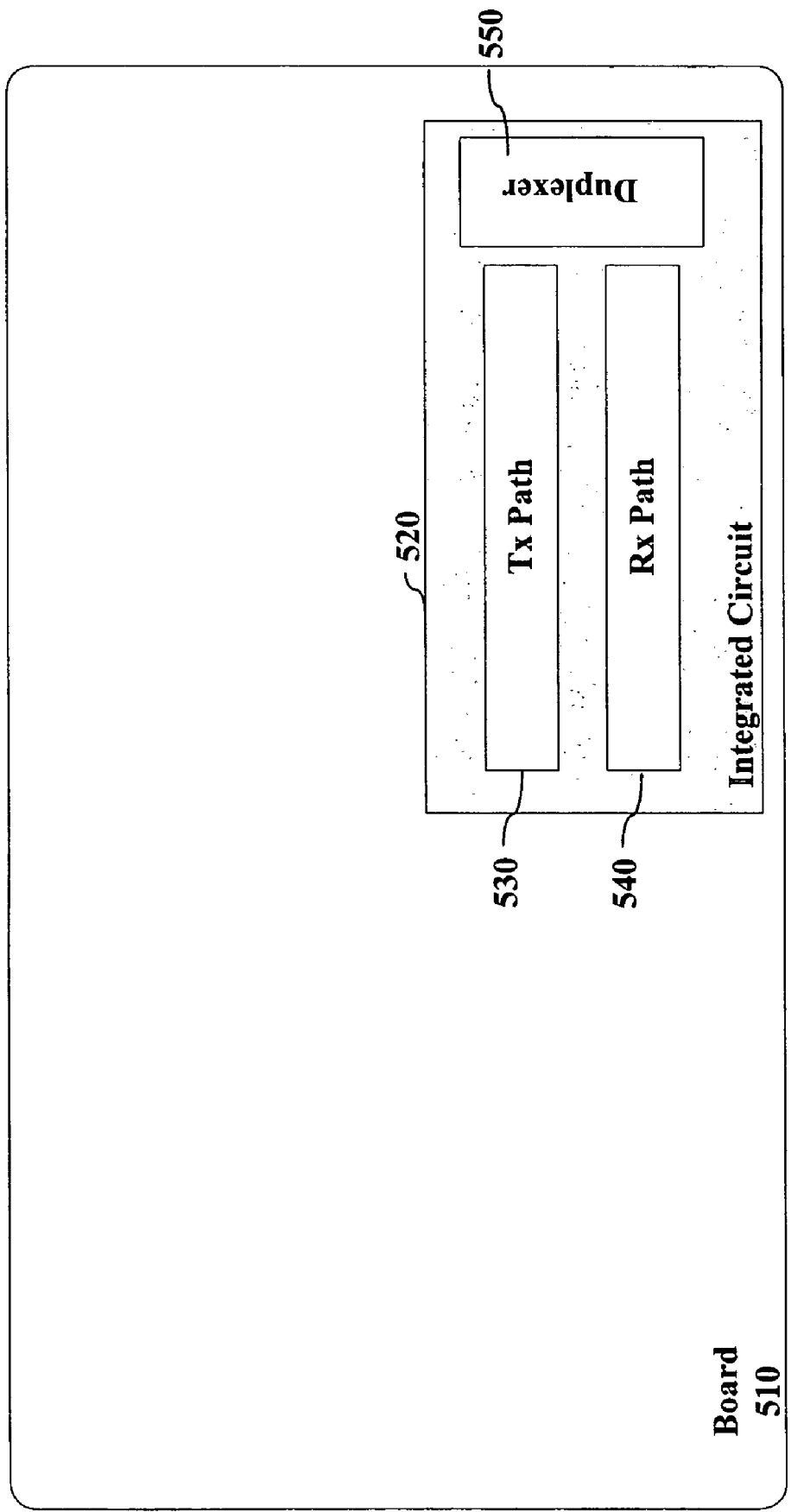
FIG. 5 is a block diagram showing an integrated circuit that obviates the need for off-chip matching elements because of the integrated impedance transformation within BAW resonator networks within the integrated circuit according to one embodiment of the invention.

One skilled in the art will recognize the numerous embodiment and advantages in the application of BAW resonator technology to provide integrated filtering functionality and impedance transformation. One such advantage is illustrated in FIG. 5 which shows an RF circuit having all of its impedance matching elements integrated within the chip. In particular, the complete transmit signal path 530, receiver signal path 540, and duplexer 550 are integrated in a single circuit 520. The removal of off-chip, discrete impedance matching elements, and their associated components, reduces insertion losses, board size contributions, and manufacturing costs.

Although being described above in relation to an RF transceiver circuit, the BAW resonator network, and its corresponding impedance transformation and filtering characteristics, may be applied to numerous types of electrical components and systems. Having illustrated the benefit of integrating both impedance transformation and filtering functionality on an electrical component, a more detailed discussion of certain embodiments of BAW resonator networks is provided below. These embodiments are intended to be exemplary and one skilled in the art will recognize that other BAW resonator network configurations fall within the scope of the present invention.

B. BAW Resonator Filter and Impedance Transformation

Figure 6:
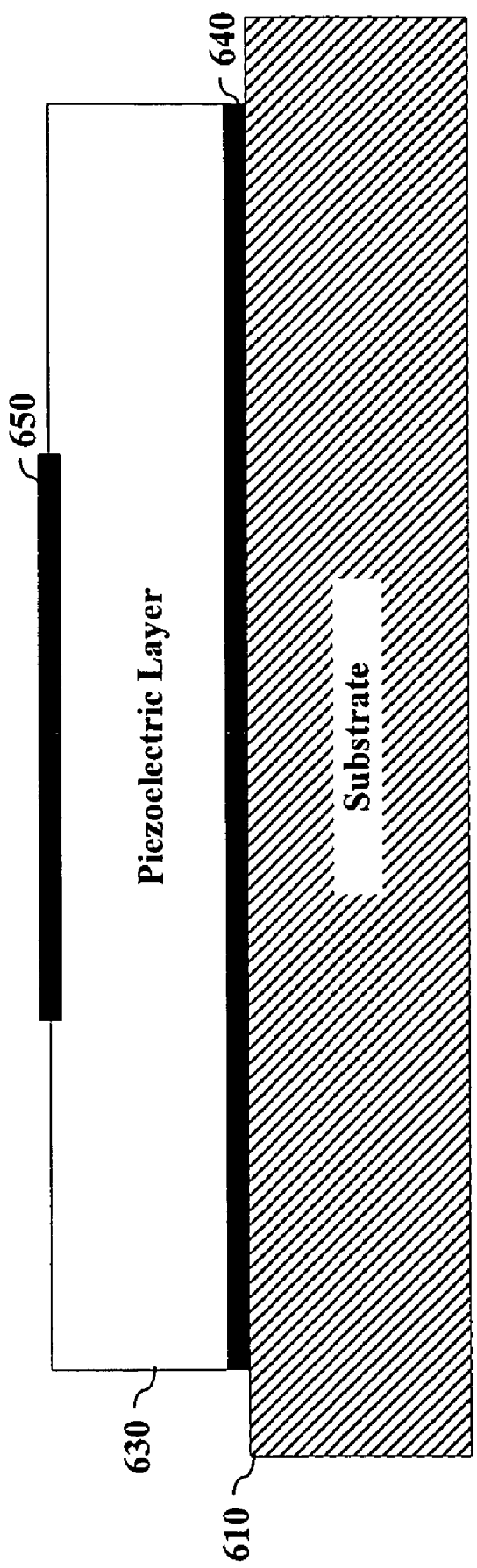
FIG. 6 is a general illustration of a BAW resonator according to various embodiments of the invention.

FIG. 6 generally illustrates a BAW resonator according to one embodiment of the invention. A BAW resonator is placed on a supporting substrate 610 such as silicon, sapphire, glass or alumina. A first electrode 640 and a second electrode 650 are positioned relative to a piezoelectric layer 630, such as a piezoelectric transducer film, to control the response of the piezoelectric material. The piezoelectric layer 630 is deposed on the supporting substrate 610 to allow physical movement, such as vibration, in response to electrical signals. This deposition process may include removal of a supporting substrate or layer to create a membrane that allows the piezoelectric layer to vibrate.

One skilled in the art will recognize that various manufacturing and configuration techniques may be employed to create a BAW resonator. For example, film bulk acoustic resonators ("FBAR") may employ an air gap or an etched away substrate below the piezoelectric to allow unimpeded vibration. A solidly mounted resonator ("SMR") uses a reflective layer(s) to isolate the piezoelectric material from the supporting substrate, thereby allowing desired resonance characteristics.

A BAW resonator network may be designed to provide filtering functionality. In particular, BAW resonators within a network may be modeled to provide a particular response to a band of frequencies, effectively forming a band pass filter or notch filter. The BAW resonator network may be may be designed to also provide an internal impedance progression or regression. One manner in which internal impedance transformation within a BAW resonator network may be designed is by adjusting the BAW resonator stack thicknesses of certain BAW resonators within the network. The stack thickness of a BAW resonator affects both the series resonant frequency ($F_S$) and the parallel resonant ($F_P$) associated with the resonator. As a BAW resonator network increases the number of its unique available resonant frequencies (both $F_s$ and $F_p$), the potential magnitude of its impedance transformation increases given a reasonable amount of allowable insertion loss.

A relationship exists between the number of available resonant frequencies and the impedance transformation losses associated with the BAW resonator network. This relationship may be considered in designing resonator networks to achieve a desired loss per transformation ratio of the network.

1. BAW Filter Model

A BAW resonator may be modeled using an RLC circuit in which a static capacitance is in parallel with a motional series capacitance and inductance. The resonant frequency $F_S$ of the resonator is defined by the characteristics of the motional capacitance and inductance, which resonates to a short circuit frequency within the model. The motional capacitance and inductance represent the motion of the piezoelectric material within the resonator. The electrical analogous components would have a very small capacitance (i.e., 100 fF) for the motional capacitor and a very large inductance (i.e., 100 nH) for the motional inductor.

The static or acoustic capacitance represents the parallel plate parasitic electrical capacitance of the piezoelectric material in a static state wherein it defines a parallel resonance mode which operates resonates similar to an open circuit. The electrical analogous component would have a large plate capacitance (i.e., 1 pF) for the static capacitance.

Figure 7:
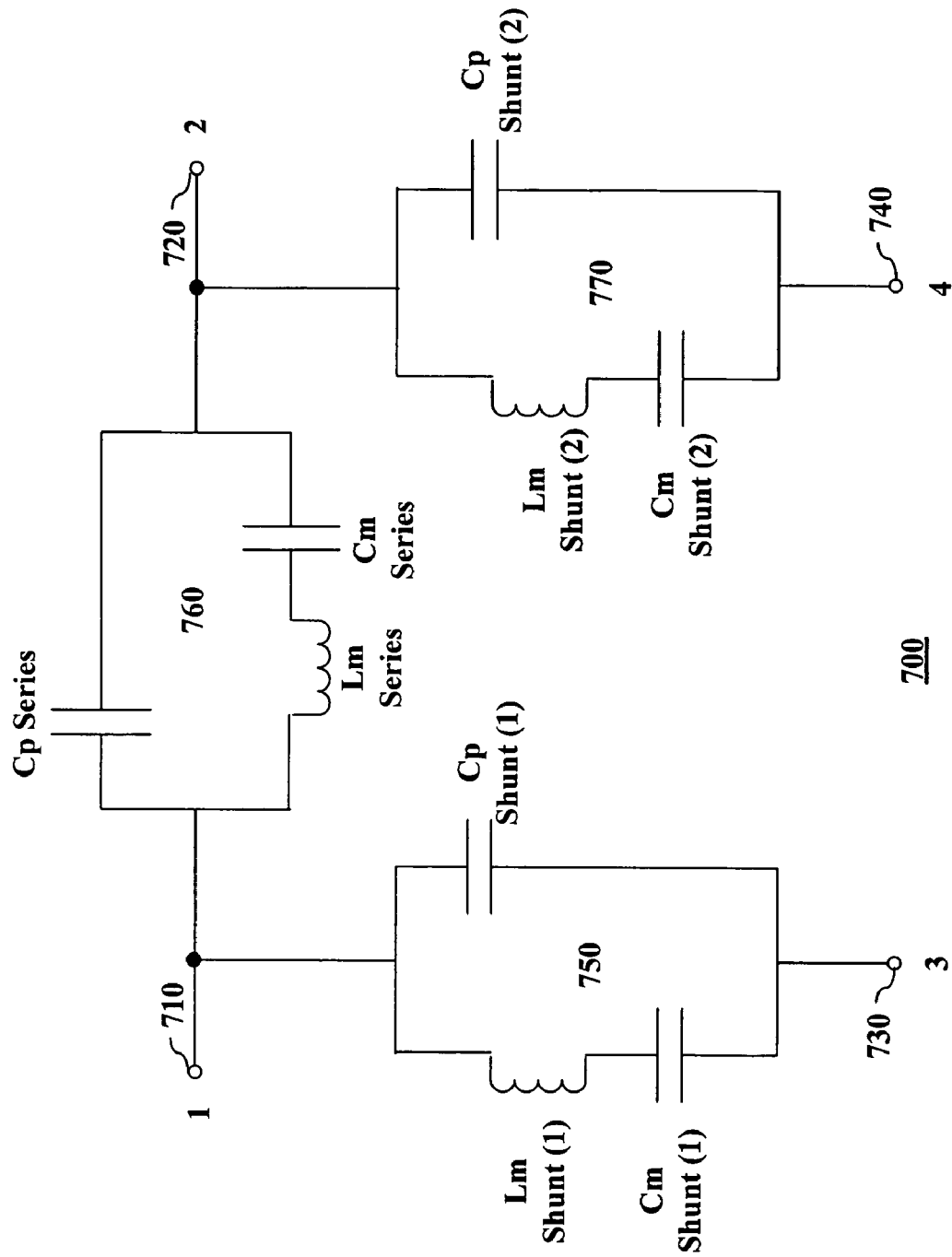
FIG. 7 shows a BAW Pi configuration circuit that models the performance of a BAW filter according to one embodiment of the invention.

An electrical model for a BAW resonator network may be generated using the above-described resonator model. Various configurations, such as a pi configuration or a tee configuration, may be used to effectively design and conceptualize the BAW resonator network characteristics. FIG. 7 illustrates an exemplary pi configuration in which the filtering functionality of the BAW filter is modeled according to one embodiment of the invention.

Referring to FIG. 7, port 1 710 is the input and port 2 720 is the output of the circuit model. Port 3 730 and port 4 740 may be coupled to a plurality of different devices including both helper inductors and electrical ground. In operation of the model, the shunt resonator will resonate to a short below the lower band edge frequency corresponding to the series resonant frequency or self resonant frequency. This shorting of the shunt resonators results in a lower stop band rejection response which is a characteristic of ladder filters. This response is similar to a Pi switch network wherein the shunt switches are shorted and the series switch is substantially resistive.

In the middle of the pass band and to the first order, the shunt resonators go anti-resonate ($F_P$ of the shunt resonators) so that they do not load the signal path. At approximately but not necessarily exactly the same frequency near the middle of the pass band, the series resonator reaches resonate frequency $F_S$ and provides a low resistance for the signal path. In the middle band, the BAW Pi network resembles a Pi switch network with the series elements shorted and the shunt elements opened.

Just above the pass band, the series BAW goes nearly open, which resembles a Pi network with the series element open and the shunt switch element substantially capacitive. Accordingly, a sharp stop band response is produced above the pass band.

2. BAW Impedance Transformation Model

Figure 8:
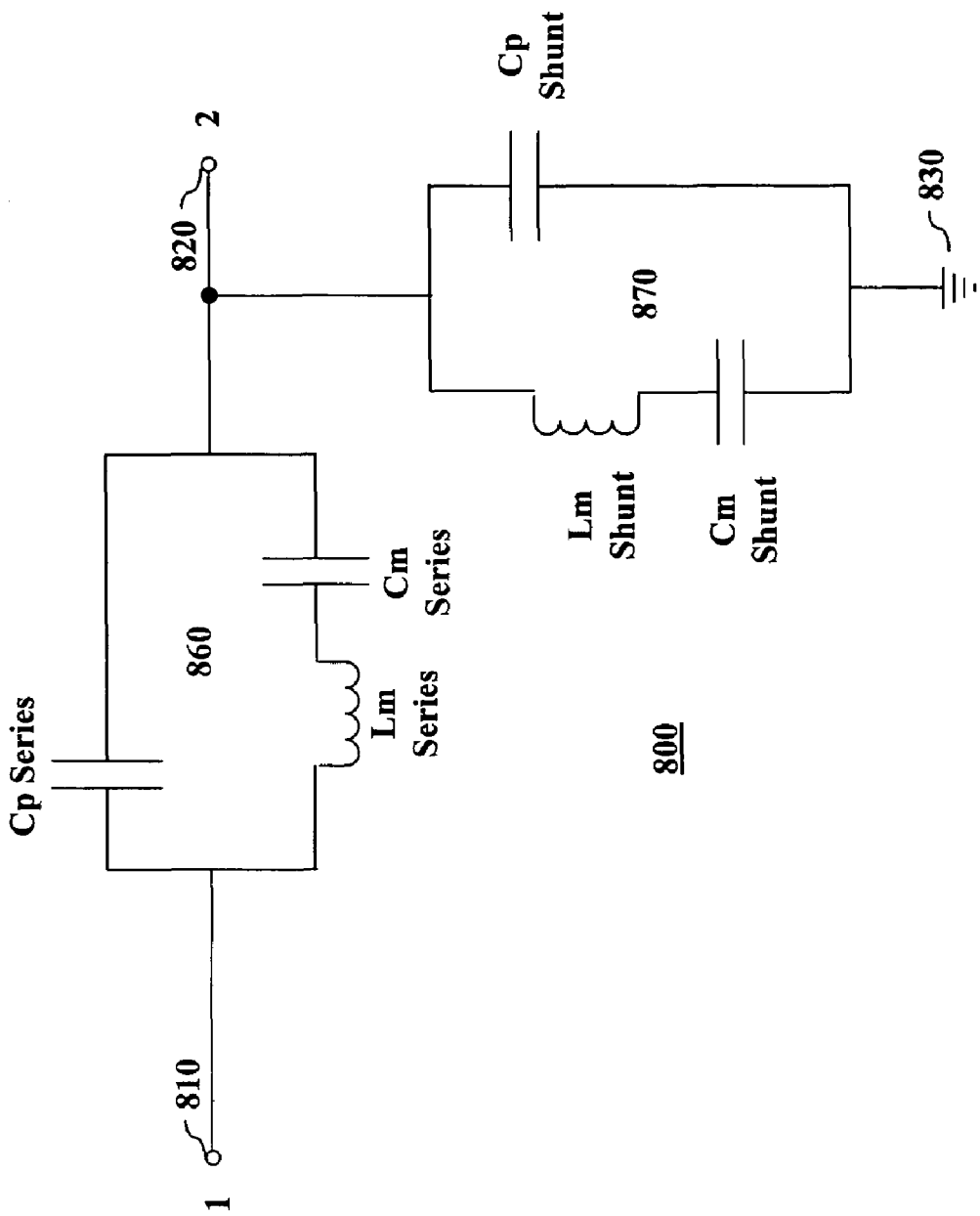
FIG. 8 illustrates a single stage BAW L network that may be used to model filter performance and impedance transformation according to one embodiment of the invention.

As mentioned above, the BAW network may be configured to provide an impedance transformation between its input and output. FIG. 8 illustrates one configuration in which this impedance transformation may be realized. In this embodiment of the invention, a single stage BAW resonator network is designed in an "L" configuration resulting in impedance transformation between its input and output.

Referring to FIG. 8, a first BAW resonator 860 is disposed between the BAW L network configuration 800 input 810 and output 820. A second BAW resonator 870 is disposed between the output 820 and ground 830. Depending on the characteristics of the first BAW resonator 860 and the second BAW resonator, a particular impedance transformation is achieved between the input 810 and the output 820. One skilled in the art will recognize that other BAW configurations may also provide impedance transformations and fall within the scope of the present invention.

In one embodiment of the invention, the single stage BAW L network 800 operates in seven modes depending on the frequency of the signal. These different modes have both varying filtering functionality and impedance transformation characteristics.

A first mode occurs when the signal frequency is well below the pass band (i.e., $F<F_s$ shunt ("$F_{sp}$")) resulting in the first resonator 860 functioning as a capacitor and the second resonator 870 also functioning as a capacitor. In this mode, the dominant reactance in the first resonator 860 is equal to the sum of $C_p$ series and $C_m$ series. The dominant reactance in the second resonator 870 would be equal to $C_p$ shunt and $C_m$ shunt value. There is no impedance transformation associated with the first mode and the signal frequency is filtered as it falls below the pass band, because series and shunt resonators out of resonance define a capacitive voltage divider.

A second mode occurs when the signal frequency is equal to or approximately equal to the lower stop band (i.e., $F \sim F_{sp}$) resulting in the first resonator 860 functioning as a capacitor and the second resonator functioning as a short between the output 820 and ground 830. The dominant reactance in the first resonator 860 is determined by $C_p$ series plus $C_m$ series. There is no impedance transformation associated with the second mode and the signal frequency is filtered.

A third mode occurs when the signal frequency is at or approximate to the lower pass band (i.e., $F_{sp}<F<F_p$ shunt ("$F_{pp}$")~$F_s$ series ("$F_{ss}$")) resulting in the first resonator 860 functioning as a capacitor and the second resonator 870 functioning as an inductor. The dominant reactance in the first resonator 860 is determined by the sum of $C_p$ series and $C_m$ series. The effective inductance in the second resonator 870 in this frequency range is determined largely by $L_m$ shunt. In this third mode, the signal is passed through the filter and an impedance transformation occurs between the input 810 and the output 820. It is important to note that this impedance transformation may include both real and imaginary components.

A fourth mode occurs when the signal frequency is at or approximate to the mid-band of the pass band (i.e., $F \sim F_{pp} \sim F_{ss}$) resulting in the first resonator 860 functioning like a short between the input 810 and the output 820, and the second resonator 870 functioning like an open switch. The signal is passed through the band pass filter and there is no impedance transformation between the input 810 and output 820.

A fifth mode occurs when the signal frequency is at or approximate to the upper pass band (i.e., $F_{pp} \sim F_{ss} < F < Fp$ series ("$F_{ps}$")) resulting in the first resonator 860 functioning like an inductor and the second resonator 870 functioning like a capacitor. The dominant reactance in the first resonator 860 is $L_m$ series. The dominant reactance in the second resonator 870 is $C_p$ shunt. In this fifth mode, the signal is passed through the filter and an impedance transformation occurs between the input 810 and the output 820.

The sixth mode occurs when the frequency is at or approximate to the upper stop band (i.e, $F \sim F_{ps}$) resulting in the first resonator 860 functioning like an open switch and the second resonator 870 functioning like a capacitor. The dominant reactance in the second resonator 870 is $C_p$ shunt. In this sixth mode, there is no impedance transformation and the signal frequency is attenuated.

The seventh mode occurs when the frequency is well above the pass band (i.e., $F \gg F_{ps}$) resulting in the first resonator 860 functioning as a capacitor and the second resonator 870 functioning as a capacitor. The effective capacitance in the first resonator 860 is roughly $C_p$ series. The effective capacitance in the second resonator 870 is roughly $C_p$ shunt. There is no useful impedance transformation associated with the seventh mode and the signal frequency is attenuated it falls above the pass band since the out of resonance resonators serve to capacitively divide down the signal amplitude.

Although the present invention has been described in relation to seven operating modes of a single stage L BAW network configuration, one skilled in the art will recognize that impedance transformation using BAW technology may be achieved using other configurations having a different number of operating modes.

C. BAW Filter and Impedance Performance

Figure 9B:
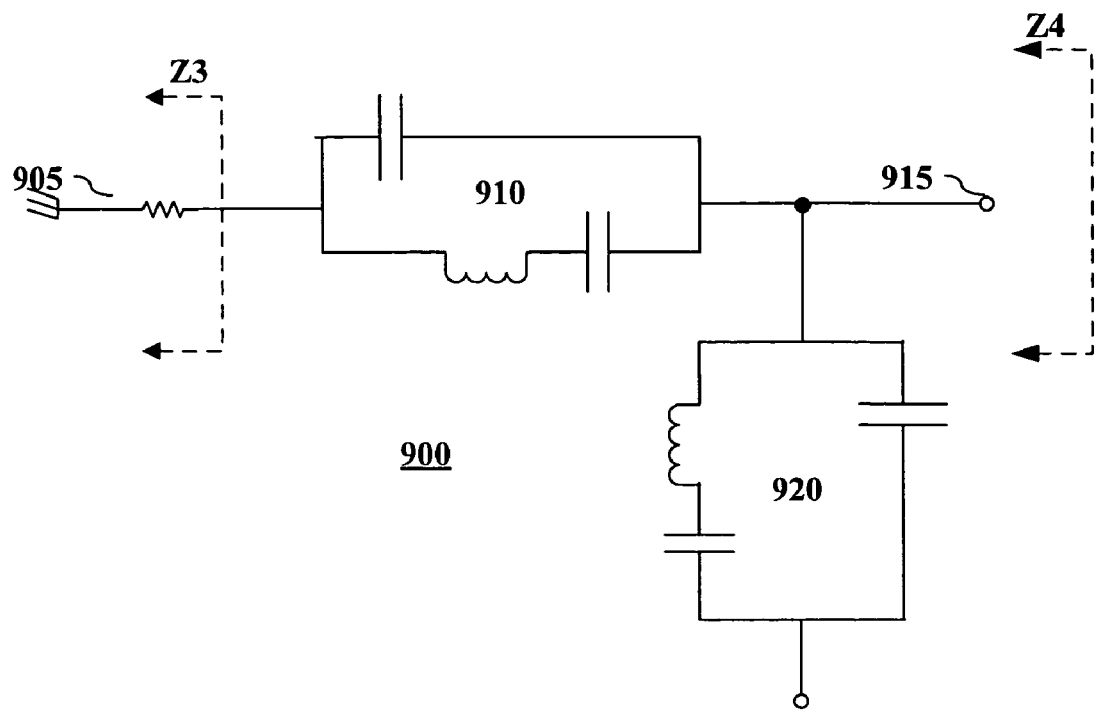
FIGS. 9A and 9B illustrate stage loading measurement locations within a single-stage BAW L configuration network according to one embodiment of the invention.
Figure 9A:
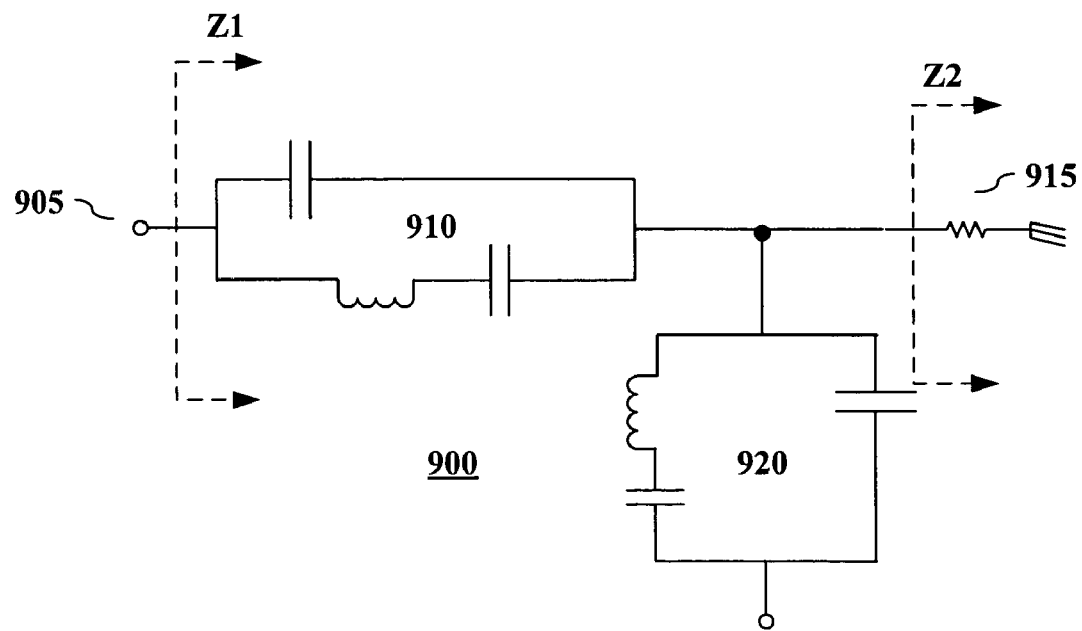
Figure 10:
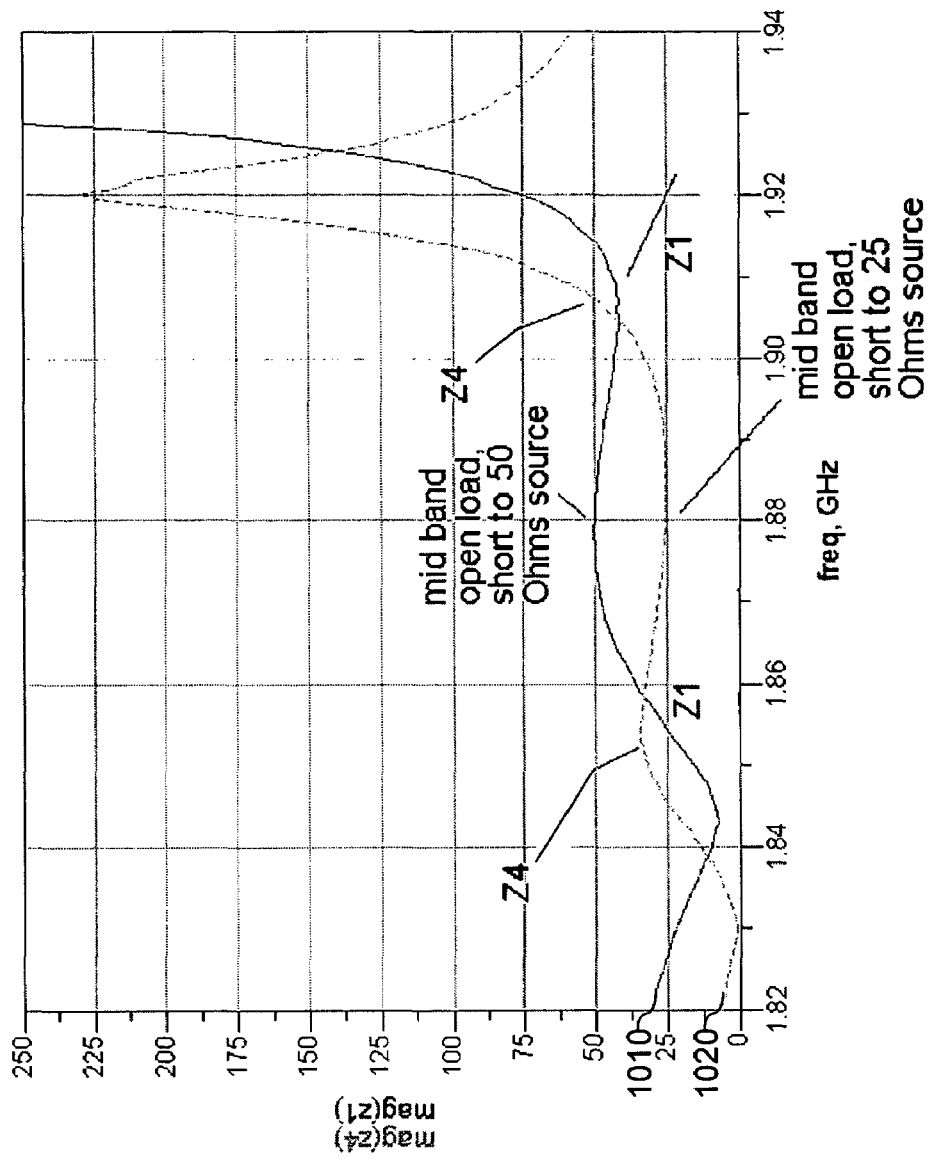
FIG. 10 is a plot illustrating a relationship between impedance and frequency relative to the single stage BAW L network shown in FIGS. 9A and 9B.
Figure 11:
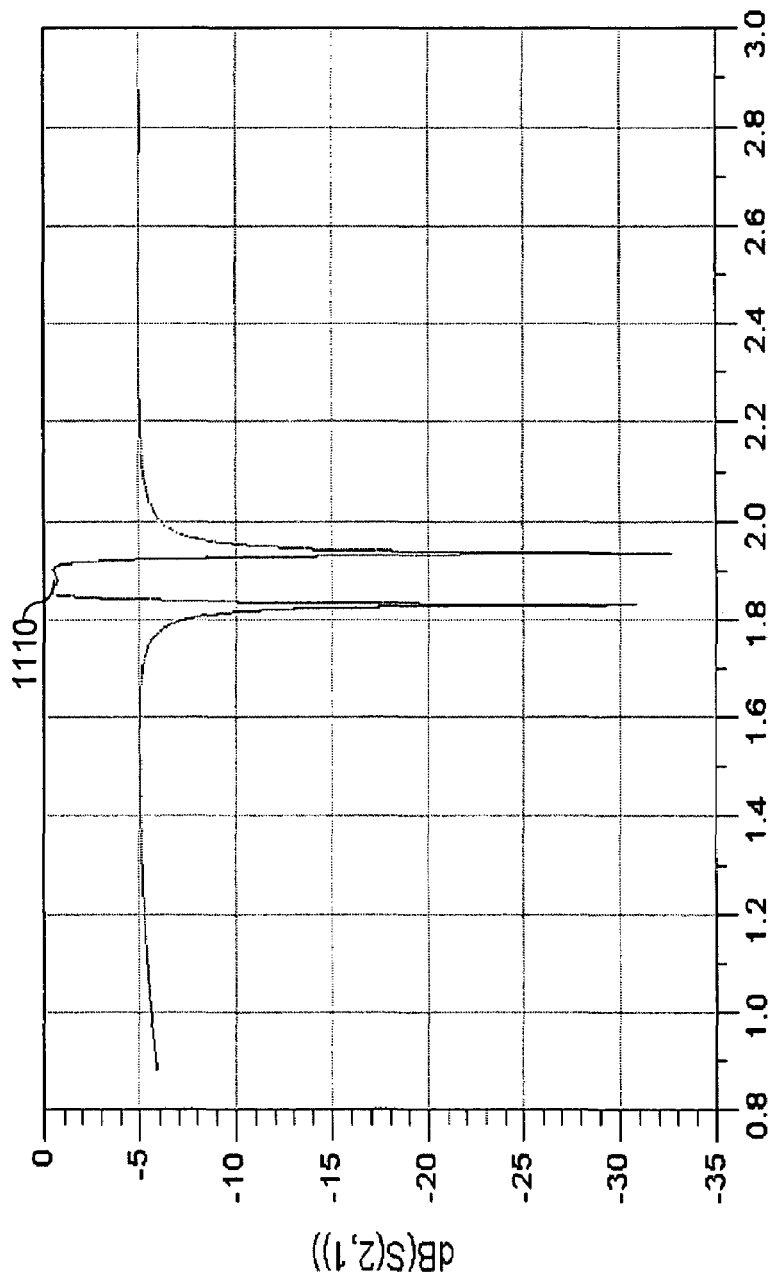
FIG. 11 is a plot illustrating band pass filtering characteristics of the single-stage BAW L network shown in FIGS. 9A and 9B.

FIGS. 9-11 illustrate an example of the filtering and impedance transformation performance of single stage BAW L network device according to one embodiment of the invention.

Referring to FIG. 9A, a single stage BAW L network 900 is shown having a first BAW resonator 910 and a second BAW resonator 920. Stage loading is illustrated in which a first impedance Z1 and a second impedance Z2 are used to explain an impedance transformation from the first port 905 and the second port 915. Referring to FIG. 9B, the BAW L network 900 is illustrated in which a third impedance Z3 and a forth impedance Z4 are used to explain an impedance transformation from the second port 915 to the first port 905.

For purposes of this example, the second BAW resonator 920 output is grounded (e.g., may be done using a helper inductor). The second port 915 will be defined as the higher impedance port and the first port 905 will be defined as the lower impedance port. In one embodiment of the invention, the second port 915 may have a 50Ω impedance and be connected to an antenna side of a duplexer, and the first port 905 may have a 25Ω impedance and be connected to another device.

Referring to FIG. 10, impedance transformation progression and regression between 50Ω and 25Ω is explained. The x-axis of the plot is frequency in gigahertz and the y-axis is an impedance magnitude. A first trace 1010 shows an impedance progression from approximately 25Ω to 50Ω between the first port 905 and the second port 915. A second trace 1020 shows an impedance digression from 50Ω to 25Ω between the first port 905 and the second port 915.

Referring to FIG. 11, the filtering characteristics of the BAW L network are explained showing a band pass filter. The x-axis is frequency in gigahertz and the y-axis is gain magnitude. Upon review of this plot, one skilled in the art will recognize that a band pass filter is realizes with a pass band 1110 with a center frequency at approximately 1.88 GHz.

An input frequency is swept from $F_s$ shunt (lower stop band) to $F_p$ series (upper stop band) to allow explanation of the single stage BAW L network response. As generally discussed above in relation to the various modes of operation, the first resonator 910 is below its series resonance during this sweep; therefore $1/(2\pi*f*C_m\text{series})$ dominates $2\pi*f*L_m\text{series}$ resulting in the first resonator 910 being capacitive. The second resonator 920 goes from a short circuit or nearly a short circuit (i.e., $L_m$shunt and $C_m$shunt are series resonant shunt loads) to an inductive load (i.e., $2\pi*f*L_m$shunt dominates $1/(2\pi*f*C_p\text{shunt}))$. At the low end of the pass band, an impedance transformation regression from the second port 915 (in this embodiment having 50Ω impedance value) may be defined having a shunt inductive load and a series capacitance.

In the middle of the pass band, the single stage BAW L network behaves much like a Pi or Tee network. In particular, the first resonator 910 becomes a switch nearly in the ON position and the second resonator 920 becomes a switch nearly in the OFF position. Accordingly, in a narrow range of the middle of the band, the BAW L network does not provide a preferred impedance transformation. As will be discussed later, a multi-stage BAW L network may be used to compensate for this issue.

At the top of the pass band, the reactive impedances of the both the first resonator 910 and the second resonator 920 become reversed from the bottom of the pass band. Because the signal frequency is above $F_p$ of the second resonator 920, the second resonator 920 becomes a capacitive load. In other words, the admittance of the second resonator 920 may be approximated as $C_p//L_m$ since the frequency is well above $F_p$ such that $1/(2\pi*f*C_p\text{shunt}) \ll 2\pi*f*L_m\text{shunt}$. The admittance of $C_p//L_m$ becomes dominated by $2\pi*f*C_p$shunt over $1/(2\pi*f*L_m\text{shunt})$. Likewise, because the frequency is above the resonant frequency $F_s$ of the first resonator 910, the first resonator 910 impedance is dominated by $2\pi*f*L_m$series over $1/(2\pi*f*C_m\text{series})$. Since the signal frequency is below $F_p$ of the first resonator 910, $2\pi*f*C_p$series does not dominate the admittance of the first resonator 910 and it becomes inductive. Accordingly, in the upper portion of the pass band, an impedance transformation regression is realized by the low pass filter characteristics (i.e., inductive first resonator 910 and capacitive second resonator 920).

The single stage BAW L network provides a good insertion loss and impedance transformations at both upper and lower bands of the pass band. However, the middle band of the pass band provides an impedance reversal. One manner in which this impedance reversal may be addressed is by cascading multiple single stage BAW L networks into a multi-stage BAW L network. This multi-stage BAW L network may also produce a larger impedance transformation than the single stage BAW L network. For example, the multi-stage BAW L network may significantly reduce or obviate entirely the matching network between a power amplifier (approximately 3Ω) and a commercial duplexer (approximately 50Ω) in the RF environment previously described.

1. Multi-Stage BAW L Network Performance

Figure 12:
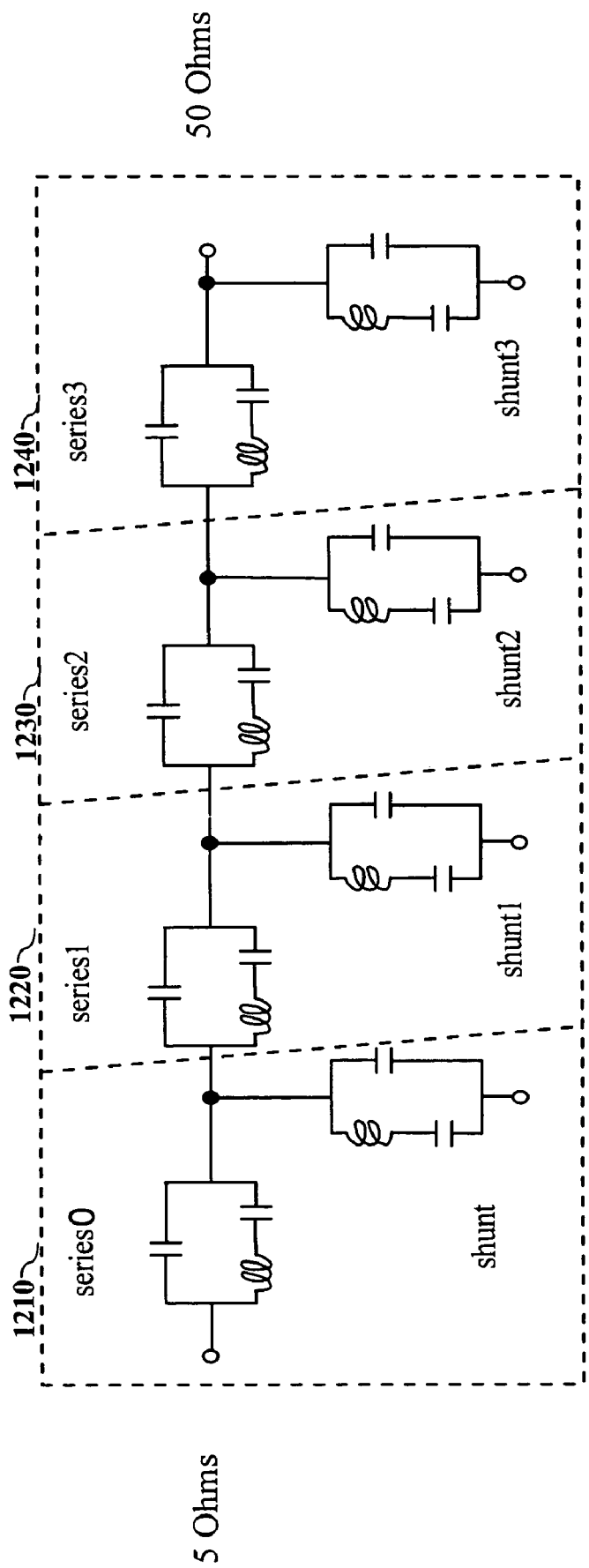
FIG. 12 illustrates a multi-stage BAW L network that provides both filtering and impedance transformation functionality according to one embodiment of the invention.

FIG. 12 illustrates a four stage BAW network according to one embodiment of the invention. In this particular embodiment, a first stage 1210 provides an impedance transformation progression between its input (e.g., having an impedance of 5Ω) and its output, which is coupled to a second stage 1220. The second stage 1220 also provides an impedance transformation between its input and output, which is coupled to a third stage 1230. The third stage 1230 provides a further impedance transformation between its input and output, which is coupled to a fourth stage 1240. The fourth stage 1240 provides a further yet impedance transformation between its input and output (e.g., having an impedance of 50Ω).

One skilled in the art will recognize that various impedance transformation magnitudes may be realized by the number of stages within the BAW network and the specific impedance transformation characteristics of the various stages within the network.

Figure 13:
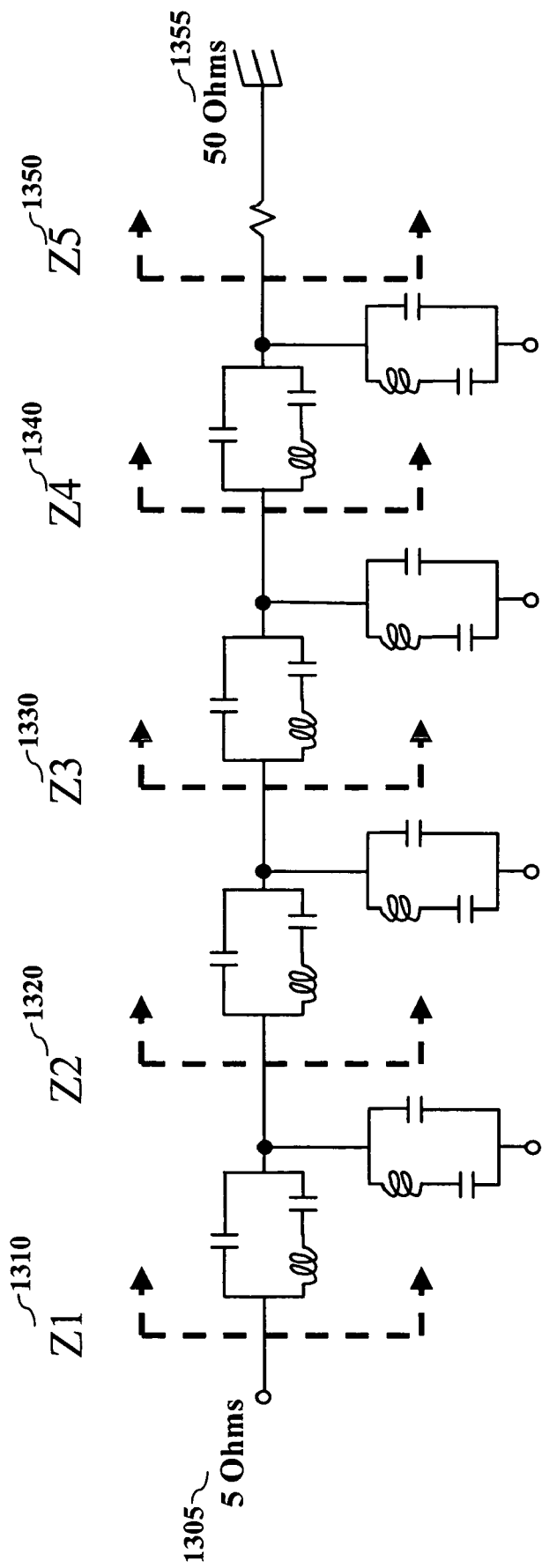
FIG. 13 illustrates stage-by-stage loading measurement locations within a multi-phase BAW L network according to one embodiment of the invention.

For purposes of explanation, FIG. 13 illustrates multiple impedance points within a multi-stage BAW L network according to one embodiment of the invention. The multi-stage BAW L network addresses the above-described limitations of a single stage BAW L network. In this particular example, an impedance progression from 5Ω at the input 1305 to 50Ω at the output 1355 is illustrated. The multi-stage BAW L network may be realized in accordance with various implementations of the invention including a first implementation in which two BAW resonator stack thicknesses are used in the manufacturing of the network. A second implementation of the present invention improves the performance of the multi-stage BAW L network but requires additional BAW resonator thicknesses be used in the manufacturing of the network. Each of these implementations and associated performance aspects will be described below.

Referring to FIG. 13, a first impedance measurement point Z1 1310 is shown at the input of the first stage of the BAW L network. A second impedance measurement point Z2 1320 is shown between the first and second stages. A third impedance measurement point Z3 1330 is shown between the second and third stages. A fourth impedance measurement point Z4 1340 is shown between the fourth and fifth stages. A fifth impedance measurement point Z5 1350 is shown at the output of the fifth stage.

The performance characteristics, including both the magnitude of impedance transformation and filtering aspects, of the multi-stage BAW L network depends on the extent of variance between the resonant frequencies of the series resonators within each stage. In particular, the magnitude of impedance transformation and quality of insertion and return loss can be improved as the number of different available series resonant frequencies within the multi-stage network increases.

Figure 14:
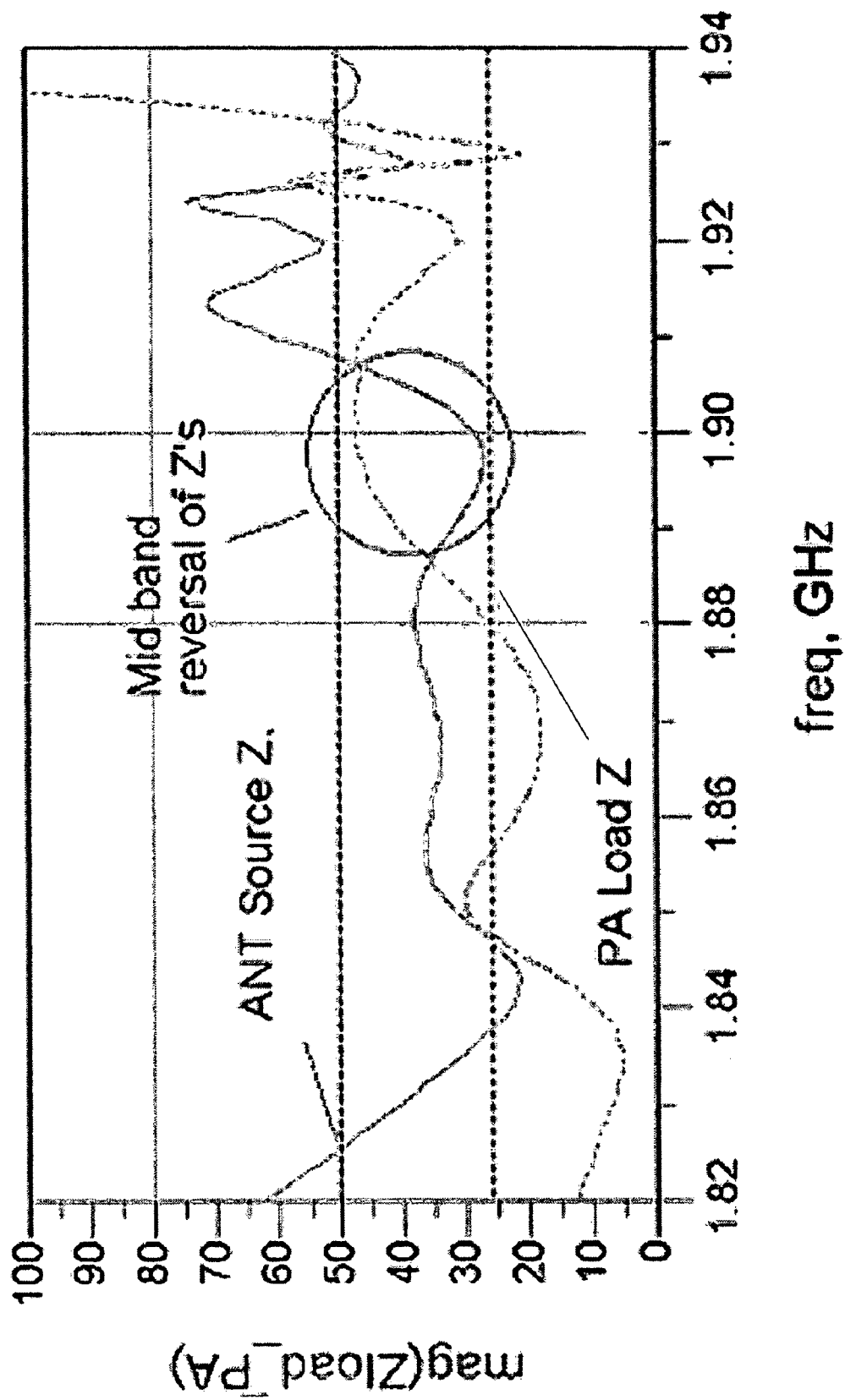
FIG. 14 is a plot illustrating a relationship between impedance and frequency relating to the multi-phase BAW L network having no more than two different resonator stack thicknesses on a substrate according to one embodiment of the invention.
Figure 15:
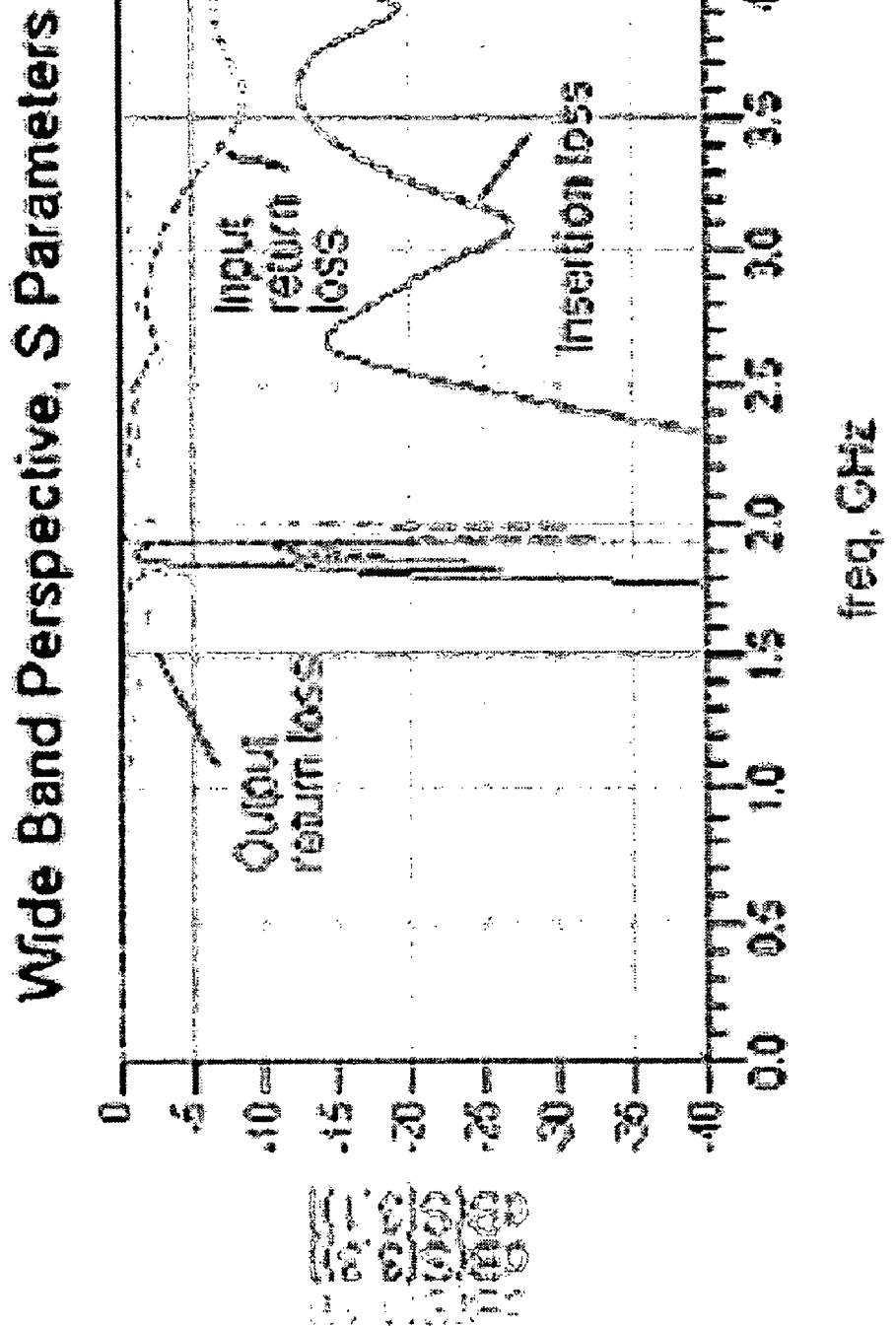
FIG. 15 is a plot illustrating a wide band perspective of S parameters for the multi-phase BAW L network having no more than two different resonator stack thicknesses on a substrate according to one embodiment of the invention.
Figure 16:
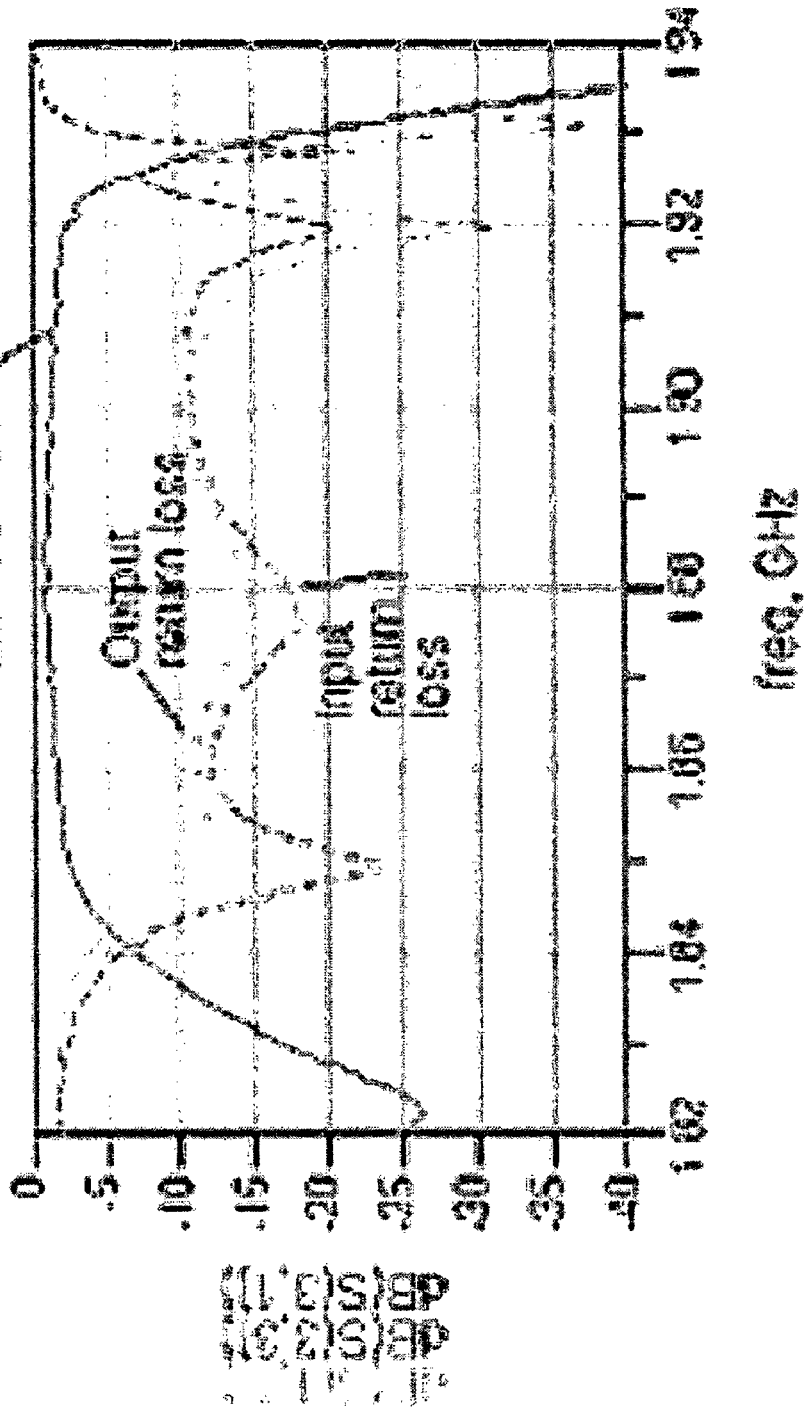
FIG. 16 is a plot illustrating a narrow band perspective of S parameters for the multi-phase BAW L network having no more than two different resonator stack thicknesses on a substrate according to one embodiment of the invention.

FIGS. 14-16 illustrate a simulation of a multi-stage BAW L network in which two resonator thicknesses are used in the manufacturing of the resonators. As shown in FIG. 14, an in-band impedance transformation from a 50Ω source impedance (Z5) to a 26Ω load impedance (Z1) is realized. The inability to achieve a full impedance transformation from 50Ω to 5Ω is caused by this particular implementation in which only two resonator thicknesses (i.e., 2 Fs/Fp realized) being manufactured on the corresponding substrate. Additionally, the mid-band impedance transformation is reversed. Although the full impedance transformation is not realized, this limited impedance transformation can reduce the number of necessary impedance matching elements on the circuit board by allowing the integration of the matching elements in an integrated circuit or module containing BAW filter substrates and RFIC substrates.

FIG. 15 provides a wide band perspective of insertion and return loss within the multi-stage BAW L network. FIG. 16 provides a narrow band perspective of the insertion and return loss of the same multi-stage BAW L network. One skilled in the art will recognize that a degraded insertion loss is realized in this particular implementation. A smaller impedance transformation shift is attained because return loss and insertion loss are not as well optimized with this simpler technology.

The return loss degrades because at mid band this version of the filter acts like an RF switch and presents the switch impedance to the output and vice versa, (i.e., impedance reversal). Insertion loss degrades as well with fewer degrees of resonator design freedom to optimize insertion loss at a given impedance transformation. Such a network can become less optimal than discrete tuning component networks, which is not the case with a higher number of different resonator stack thicknesses available for optimization. For example, as shown in FIGS. 15 and 16, an impedance transformation using only two BAW resonator stack thickness values will provide about 2 dB of insertion loss transforming from approximately 30Ω to 50Ω.

Figure 17:
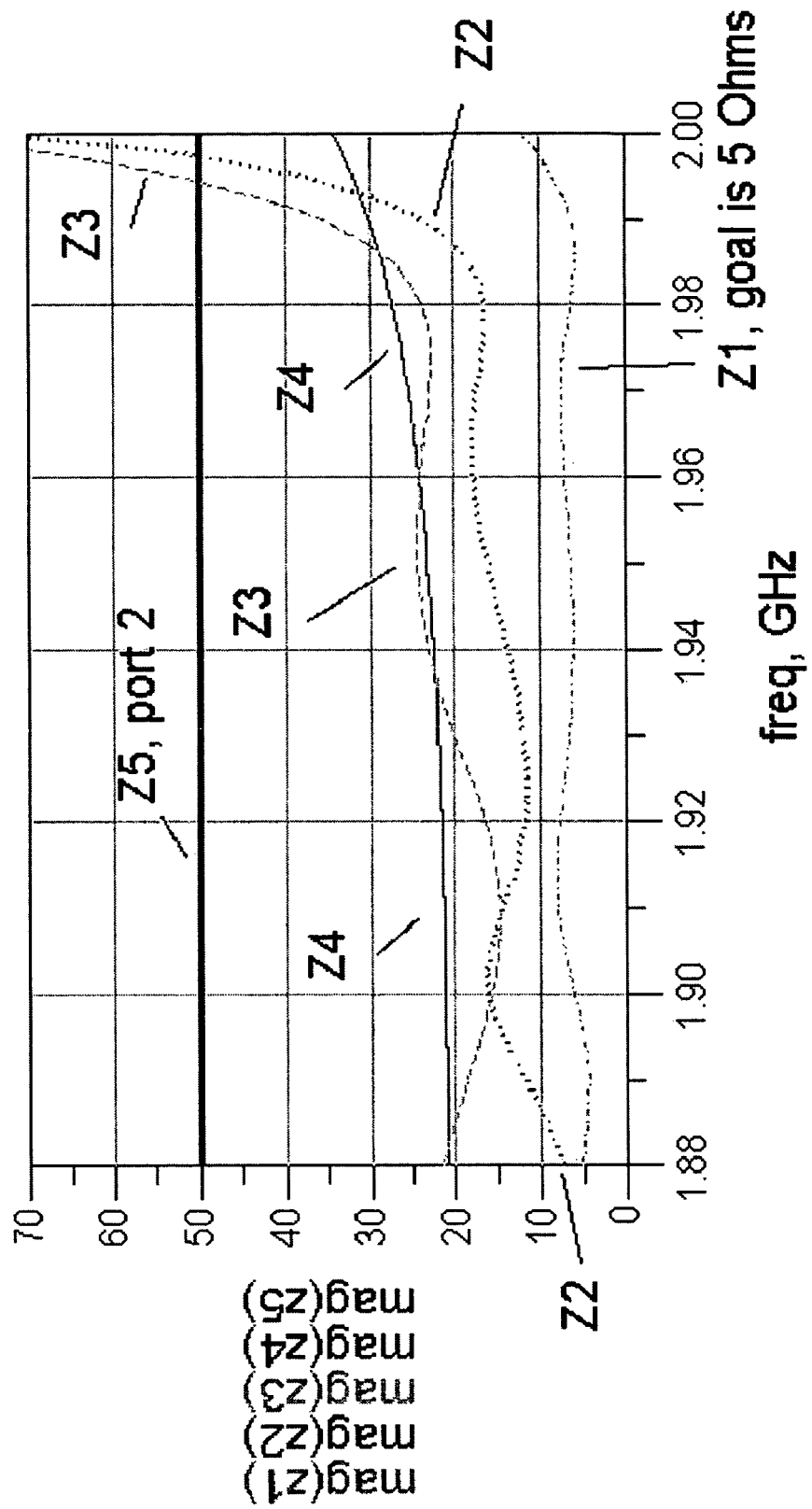
FIG. 17 is a plot illustrating a relationship between impedance and frequency relating to a multi-phase BAW L network manufactured having eight different resonator thicknesses and corresponding series resonant frequencies according to one embodiment of the invention.
Figure 18:
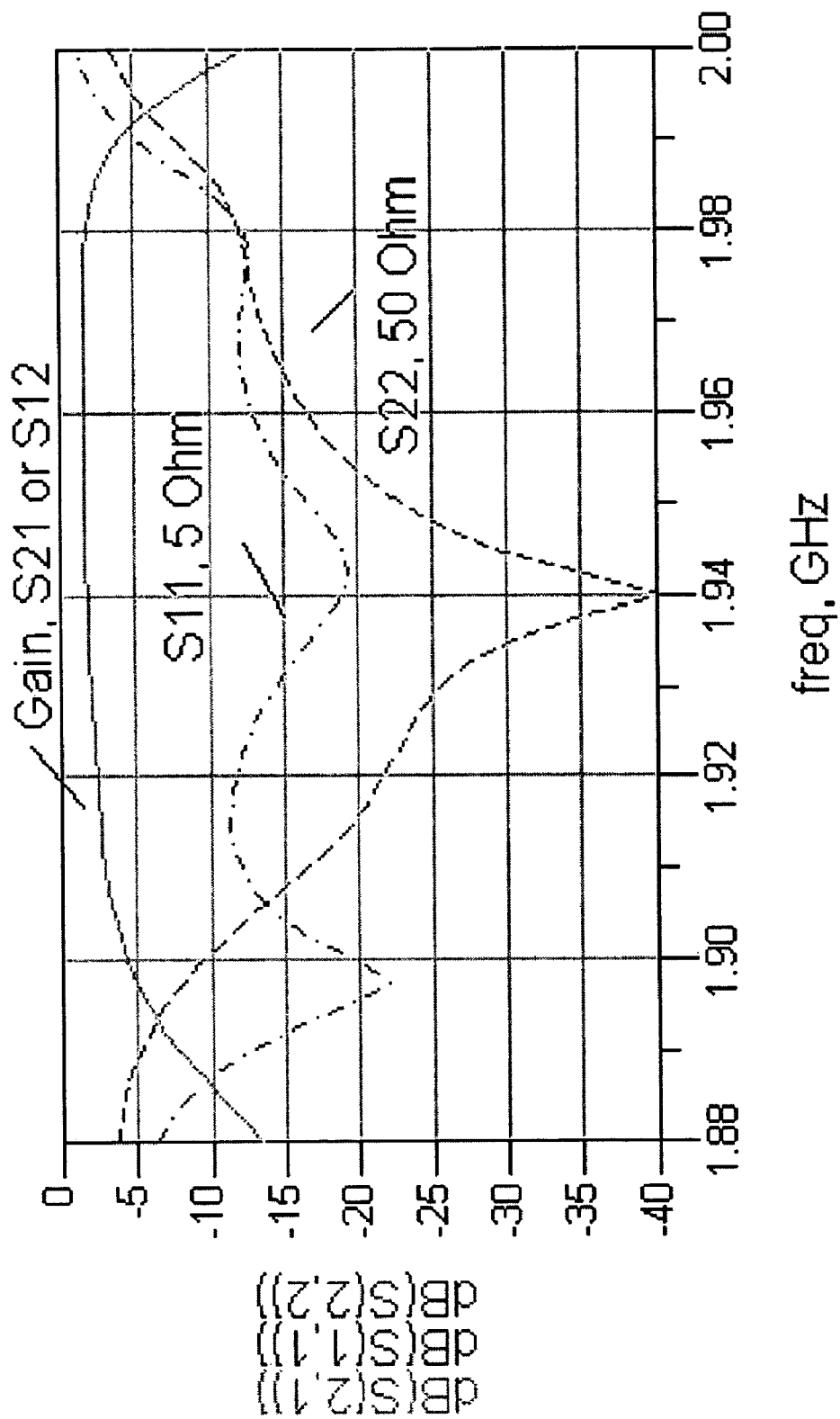
FIG. 18 is a plot illustrating a wide band perspective of S parameters for the multi-phase BAW L network having eight different resonator stack thicknesses on a substrate according to one embodiment of the invention.
Figure 19:
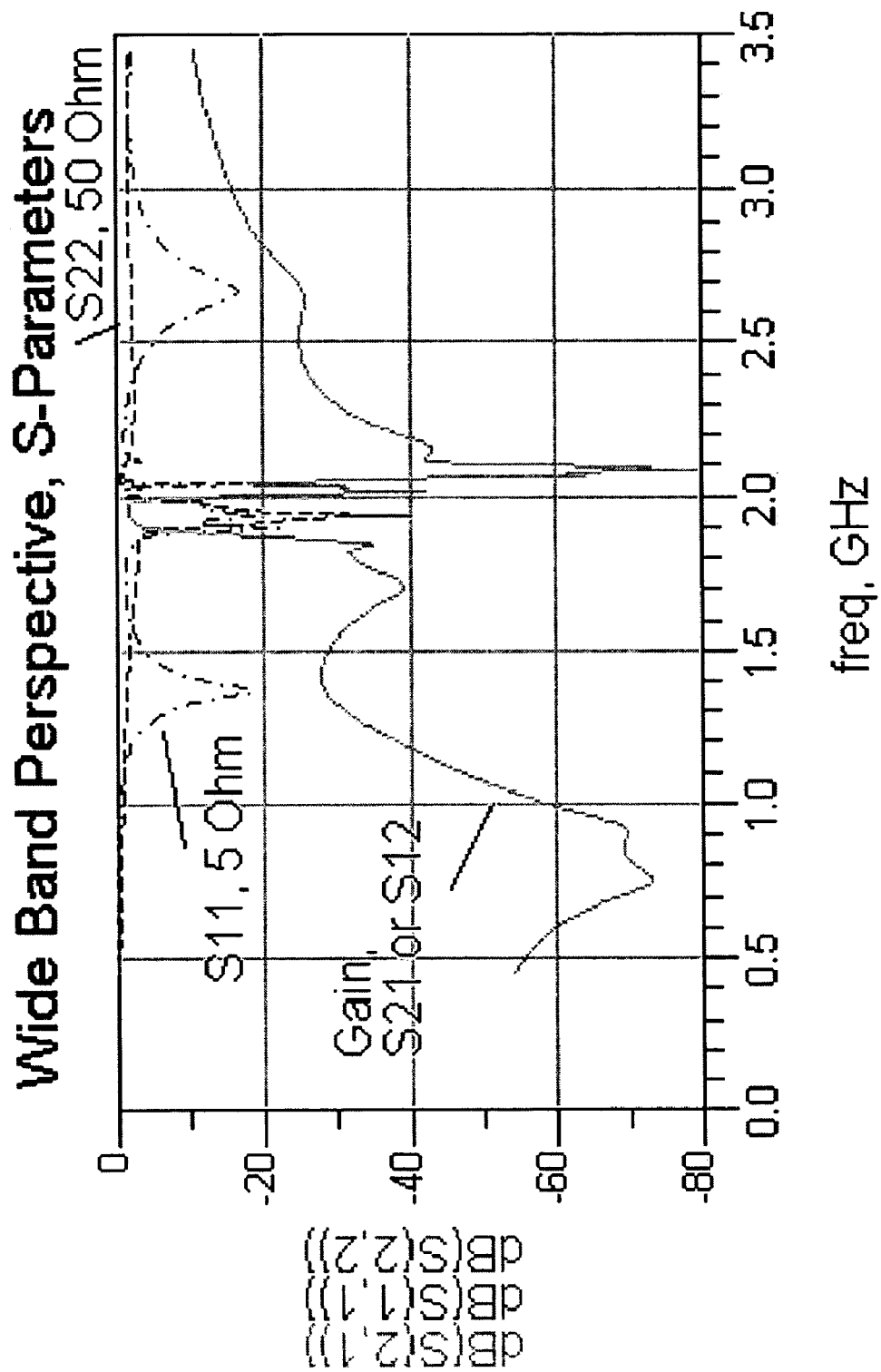
FIG. 19 is a plot illustrating a narrow band perspective of S parameters for the multi-phase BAW L network having eight different resonator stack thicknesses on a substrate according to one embodiment of the invention.

It is important to note that the manufacturing complexity increases as the number of unique resonator stack thicknesses are used within the multi-stage BAW L network. However, this increase in the number of unique thicknesses enhances the performance capability of the multi-stage BAW L network. FIGS. 17-19 simulate the performance of a multi-stage BAW L network having eight unique thicknesses resulting in four different series resonant frequencies within the multi-stage network.

In this particular simulation, for each stage 1210 1220 1230 1240 the series resonant frequency Fs is about 3.3% higher than the resonant frequency of the shunt resonator. Cp values are chosen such that the series BAW motional inductance is low and the plate capacitance is high on the input impedance side (e.g., 5Ω). This insures lower impedance or higher admittance on the left most L stages to transform the lower impedance. Likewise, on the output impedance (e.g., 50Ω), higher motional inductance and lower plate capacitance is selected to transform the impedance. For example, "Development of Low-Loss Band-Pass Filters Using SAW Resonators for Portable Devices," by O. Ikata, et. al, published in 1992 Ultrasonics Symposium 1992 (1051-0117/92/0000-0111), which is incorporated by reference in its entirety, discusses in more detail the relationship between filter impedance and resonator capacitance and inductance.

It is desirable to avoid stacking the mid pass band $F_p$ shunt (and the $F_s$ series) for each stage at precisely the same frequencies as each other. Accordingly, all series resonators are not "thru" at the same frequency that all shunt resonators are open in band, but instead, some are low pass and some are high pass at the same mid band frequency. In other words, these $F_s$ series values were intentionally interspersed throughout the middle of the pass band to achieve a desirable performance.

For clarity of illustration, the following table discloses detailed equivalent circuit values used to generate FIGS. 17-19.

| Series_res.Fsr_MHz | Series_res.Fpr_MHz | Series_res.Cp_pF |
|---|---|---|
| 2041.800 | 2094.898 | 7.300 |
| Shunt_res.Fsr_MHz | Shunt_res.Fpr_MHz | Shunt_res1.Cp_pF |
| 1976.573 | 2027.975 | 4.000 |
| Series_res1.Fsr_MHz | Series_res1.Fpr_MHz | Series_res1.Cp_pF |
| 2014.400 | 2066.785 | 7.800 |
| Shunt_res1.Fsr_MHz | Shunt_res1.Fpr_MHz | Shunt_res1.Cp_pF |
| 1950.048 | 2000.760 | 4.000 |
| Series_res2.Fsr_MHz | Series_res2.Fpr_MHz | Series_res2.Cp_pF |
| 1963.700 | 2014.767 | 2.000 |
| Shunt_res2.Fsr_MHz | Shunt_res2.Fpr_MHz | Shunt_res2.Cp_pF |
| 1900.968 | 1950.403 | 4.200 |
| Series_res3.Fsr_MHz | Series_res3.Fpr_MHz | Series_res3.Cp_pF |
| 2031.600 | 2084.433 | 2.100 |
| Shunt_res3.Fsr_MHz | Shunt_res3.Fpr_MHz | Shunt_res3.Cp_pF |
| 1966.699 | 2017.844 | 6.900 |

| Series_res.Lmotional_nH | Shunt_res.Lmotional_nH |
|---|---|
| 15.797 | 4.491 |
| Series_res1.Lmotional_nH | Shunt_res1.Lmotional_nH |
| 15.190 | 31.607 |
| Series_res2.Lmotional_nH | Shunt_res2.Lmotional_nH |
| 62.339 | 31.677 |
| Series_res3.Lmotional_nH | Shunt_res3.Lmotional_nH |
| 55.468 | 18.014 |

Referring to FIG. 17, one skilled in the art will recognize the impedance transformation from 5Ω at Z1 to 50Ω at Z5. Furthermore, the impedance progression occurs without any impedance reversal at the mid-band of the pass band. So the impedance of Z5 does not approach 50 Ohms in mid band, but remains near 5 Ohms in FIG. 17. Contrariwise, FIG. 14 shows the 25 Ohm port seeing about 50 Ohms near (or slightly above) the middle of the passband, indicating impedance reversal.

FIGS. 18 and 19 show both a wide band and narrow band perspective of the S parameters of the multi-stage BAW network. One skilled in the art will recognize the improved insertion and return loss performance of this multi-stage network relative to the previously described network. In particular, mid band return loss is very good (indicating a lack of impedance reversal) and impedance is fairly well controlled within the passband.

While a four stage implementation of the multi-stage BAW network has been described, one skilled in the art will recognize that the number of stages within the network may vary depending on the desired specifications of impedance transformation and filtering. Furthermore, although the BAW stages have been described in an L configuration, other configurations may be used; each offering various filtering and impedance transformation characteristics. For example, a Pi network may be used to transform impedance if the shunt BAW resonators are asymmetrical, providing a different shunt impedance at one port versus the other port. Likewise, asymmetrical Tee networks may also be used for BAW impedance transformation without coupled resonators. Additionally, differential lattice configurations may be used to realize an impedance transformation.

The present invention is not limited to power amplifiers and transmit signal path applications. For example, the invention may be applied to the receive-side duplexer to noise match the antenna (e.g., a 50Ω impedance) to a low noise amplifier (e.g., a 200-j20Ω impedance).

The present invention may also be used to obtain reasonable arbitrary reactive matches. Typically, an inductive match is used to cancel the output capacitance of a power amplifier, power amp driver or low noise amplifier. However, this inductive match may be accomplished by either adding the conjugate of the desired porting impedance and retuning $R_s$ and $F_p$ to realize the previous response, or adding the active circuit or other circuit requiring reactive matching to facilitate the synthesis of the new desired BAW network.

The foregoing description of the invention has been described for purposes of clarity and understanding. It is not intended to limit the invention to the precise form disclosed. Various modifications may be possible within the scope and equivalence of the appended claims.

We claim:

1. A single stage bulk acoustic wave ("BAW") resonator L network, comprising:
   an input for receiving an electrical signal;
   a series BAW resonator, coupled to the input, having an associated series resonant frequency;
   a shunt BAW resonator, coupled to the series resonator in an L configuration, having an associated parallel resonant frequency;
   an output for transmitting the electrical signal; and
   wherein an impedance transformation occurs between the input and the output and has a magnitude related to the series resonant frequency and the parallel resonant frequency.

2. The single stage BAW resonator L network of claim 1 wherein the network operates in a plurality of modes, each mode having both impedance transformation and filtering functionality characteristics associated therewith.

3. The single stage BAW resonator L network of claim 2 wherein a pass band filter is realized having a lower band, a middle band, and an upper band.

4. The single stage BAW resonator L network of claim 3 wherein a first mode occurs when the frequency of the electrical signal is within the lower band of the pass band resulting in an impedance transformation between the input and the output.

5. The single stage BAW resonator L network of claim 3 wherein a second mode occurs when the frequency of the electrical signal is within the middle band of the pass band.

6. The single stage BAW resonator L network of claim 3 wherein a third mode occurs when the frequency of the electrical signal is within the upper band of the pass band resulting in an impedance transformation between the input and the output.

7. The single stage BAW resonator L network of claim 1 wherein the series BAW resonator and the shunt BAW resonator are film bulk acoustic resonators.

8. The single stage BAW resonator L network of claim 1 wherein the series BAW resonator and the shunt BAW resonator are solidly mounted resonators.

9. A multi-stage BAW resonator network, comprising
an input for receiving an electrical signal;
a plurality of single stage BAW resonator networks, each stage having an associated series resonant frequency and parallel resonant frequency, that are cascaded together;
an output for transmitting the electric signal; and
wherein each stage within the plurality of single stage BAW resonator networks has an associated impedance transformation related its series resonant frequency and parallel resonant frequency of each stage; and
wherein an impedance transformation between the input and the output is related to the associated impedance transformations of the single stage BAW resonator networks.

10. The multi-stage BAW resonator network of claim 9 wherein the network is limited to two BAW resonator stack thicknesses.

11. The multi-stage BAW resonator network of claim 10 wherein the network has only one unique series resonant frequency and one unique parallel resonant frequency.

12. The multi-stage BAW resonator network of claim 10 wherein the input has an impedance of approximately 30 Ohms and the output has an impedance of approximately 50 Ohms.

13. The multi-stage BAW resonator network of claim 9 wherein at least three BAW resonator stack thicknesses are used within the network.

14. The multi-stage BAW resonator network of claim 13 wherein a plurality of series resonant frequencies parallel resonant frequencies are realized within the network.

15. The multi-stage BAW resonator network of claim 14 wherein the input has an impedance of approximately 4 Ohms and the output has an impedance of approximately 50 Ohms.

16. The multi-stage BAW resonator network of claim 9 wherein at least one single stage resonator network within the plurality is designed in a L configuration.

17. The multi-stage BAW resonator network of claim 9 wherein at least one single stage resonator network within the plurality is designed in a Pi configuration.

18. The multi-stage BAW resonator network of claim 9 wherein at least one single stage resonator network within the plurality is designed in a Tee configuration.

19. The multi-stage BAW resonator network of claim 9 wherein the multi-stage network is integrated within an RF duplexer.

20. The multi-stage BAW resonator network of claim 9 wherein the multi-stage network is integrated within a transmit path of an RF transceiver.

21. The multi-stage BAW resonator network of claim 9 wherein the multi-stage network is integrated with a receiver path of an RF transceiver.

22. The multi-stage BAW resonator network of claim 9 wherein at least one single stage BAW resonator network within the plurality is a film bulk acoustic resonator.

23. The multi-stage BAW resonator network of claim 9 wherein at least one single stage BAW resonator network within the plurality is a solidly mounted resonator.

24. The multi-stage BAW resonator network of claim 9 wherein the input has an impedance of approximately 30 Ohms and the output has an impedance of approximately 50 Ohms.

25. The multi-stage BAW resonator network of claim 9 wherein the input has an impedance of approximately 4 Ohms and the output has an impedance of approximately 50 Ohms.

26. A method for providing an impedance transformation and a band pass filter within an integrated component, the method comprising:
having a first impedance value at an input of a first single stage BAW resonator network;
cascading at least one additional single stage BAW resonator network to the first single stage BAW resonator network, the first single stage BAW resonator network and the at least one additional single stage BAW resonator network having a series resonant frequency and parallel resonant frequency;
having a second impedance value at an output of the at least one additional single stage BAW resonator network;
only transmitting a signal frequency band through the first single stage BAW resonator network and the at least one additional single stage BAW resonator network; and
wherein the first impedance value and the second impedance value are not equal and are related to the series resonant frequency and the parallel resonant frequency.

27. The method of claim 26 wherein the first single stage BAW resonator network comprises a series BAW resonator and a shunt BAW resonator coupled in an L configuration.

28. The method of claim 27 wherein an impedance transformation magnitude across the first single stage BAW resonator is related to a first resonant frequency of the series BAW resonator and a second resonant frequency of the shunt BAW resonator.

29. The method of claim 26 wherein the first single stage BAW resonator network and the at least one additional single stage BAW resonator network only have one unique series resonant frequency and one unique parallel resonant frequency.

30. The method of claim 26 wherein the first single stage BAW resonator network and the at least one additional single stage BAW resonator network have a plurality of unique series resonant frequencies.

31. The method of claim 30 wherein the first single stage BAW resonator network and the at least one additional single stage BAW resonator network have a plurality of unique parallel resonant frequencies.

32. The method of claim 26 wherein the first single stage BAW resonator network comprises at least two film bulk acoustic resonators.

33. The method of claim 26 wherein the first single stage BAW resonator network comprises at least two solidly mounted resonators.

34. The method of claim 26 wherein the first single stage BAW resonator network comprises a plurality of resonators in a Pi configuration.

35. The method of claim 26 wherein the first single stage BAW resonator network comprises a plurality of resonators in a Tee configuration.

* * * * *